US006878782B2

(12) United States Patent
Merfeld et al.

(10) Patent No.: US 6,878,782 B2
(45) Date of Patent: *Apr. 12, 2005

(54) THERMOSET COMPOSITION, METHOD, AND ARTICLE

(75) Inventors: Glen David Merfeld, Loudonville, NY (US); Gary William Yeager, Rexford, NY (US); Robert Edgar Colborn, Niskayuna, NY (US); Bryan Duffey, Ballston Spa, NY (US)

(73) Assignee: General Electric, Pittsfield, MA (US)

( * ) Notice: Subject to any disclaimer, the term of this patent is extended or adjusted under 35 U.S.C. 154(b) by 320 days.

This patent is subject to a terminal disclaimer.

(21) Appl. No.: 10/063,292

(22) Filed: Apr. 9, 2002

(65) Prior Publication Data

US 2002/0169256 A1 Nov. 14, 2002

Related U.S. Application Data

(63) Continuation-in-part of application No. 09/682,057, filed on Jul. 16, 2001, now Pat. No. 6,627,704, which is a continuation-in-part of application No. 09/452,733, filed on Dec. 1, 1999, now Pat. No. 6,352,782.

(51) Int. Cl.[7] .................. C08L 71/12; C09D 171/12
(52) U.S. Cl. .................. 525/391; 525/132; 525/139; 525/393; 525/394; 525/534; 428/457; 428/458; 428/461; 428/462; 428/463
(58) Field of Search ................ 525/132, 139, 525/391, 393, 394, 534; 428/457, 458, 461, 462, 463

(56) References Cited

U.S. PATENT DOCUMENTS

| 3,280,089 A | 10/1966 | Wright |
| 3,281,383 A | 10/1966 | Zelinski et al. |
| 3,285,895 A | 11/1966 | MacKenzie et al. |
| 3,306,875 A | 2/1967 | Hay |
| 3,356,761 A | 12/1967 | Fox |
| 3,375,228 A | 3/1968 | Holoch et al. |
| 3,476,722 A | 11/1969 | Schlatzer |
| 3,557,045 A | 1/1971 | Wright et al. |
| 3,595,942 A | 7/1971 | Wald et al. |
| 3,597,216 A | 8/1971 | Berardinelli et al. |
| 3,637,578 A | 1/1972 | Wright et al. |
| 3,808,286 A | 4/1974 | Olund |

(Continued)

FOREIGN PATENT DOCUMENTS

| DE | 31 17 514 A1 | 2/1981 |
| DE | 3117514 A1 | 12/1982 |
| DE | 41 03 140 A1 | 2/1991 |
| EP | 0 135 124 A2 | 10/1984 |
| EP | 0 206 072 B2 | 9/1986 |
| EP | 0 261 574 B1 | 9/1987 |
| EP | 0 385 065 A1 | 10/1990 |
| EP | 0 498 088 B1 | 12/1991 |
| EP | 0 507 377 A1 | 3/1992 |
| NL | 8902092 | 8/1989 |

OTHER PUBLICATIONS

U.S. Appl. No. 09/681,376, filed Mar. 27, 2001, Zarnoch et al.
U.S. Appl. No. 09/681,381, filed Mar. 27, 2001, Teutsch et al.
U.S. Appl. No. 09/683,214, filed Dec. 3, 2001, Yeager et al.
U.S. Appl. No. 09/683,352, filed Dec. 18, 2001, Braat et al.
U.S. Appl. No. 09/765,065, filed Jan. 17, 2001, Zarnoch et al.
U.S. Appl. No. 10/063,152, filed Mar. 26, 2002, Braat et al.
U.S. Appl. No. 10/119,406, filed Apr. 9, 2002, Yeager et al.
Derwent Abstracts for JP08–245872.
Li W et al: "Shrinkage control of low–profile unsaturated polyester resins cured at low temperature" POLYMER, GB, Elsevier Science Publishers B.V, vol. 39, No. 23, Nov. 1, 1998, pp. 5677–5687, XP004129151.
Coleen Pugh and V. Percec, "Group Transfer Polymerization of Some Unusual Acrylates and Methacrylates", Polym. Prepr. (Am. Chem. Soc., Div. Polym. Chem.), (1985), 26(2), 303–5.
V. A. Pattison et al. J. Appl. Poly. Sci, vol. 18, pp. 2763–2771 (1974).
M. K. Lindemann in G.E. Ham, Ed. "Vinyl Polymerization", vol. 1, Dekker: New York (1967), pp. 252–255.
K. K. Georgieff et al. J. Appl. Pol. Sci., 1964, vol. 8, pp. 889–896.
T.A. Callaghan, and D.R. Paul, Macromolecules (1993), vol. 26, pp. 2439–2450.
I.C. Sanchez, Polymer (1989), vol. 30, pp. 471–475.
"Plastic Additives Handbook, 4th Edition" R. Gachter and H. Muller (eds.), P.P. Klemchuck (assoc. ed.) Hansen Publishers, New York, pp. 915–935, 1993.
S. J. Monte et al. in Ann. Chem. Tech Conf. SPI (1980), Ann. Tech Conf. Reinforced Plastics and Composite inst. SPI 1979, Section 16E, pp. 1–11, New Orleans.
S. J. Monte, Modern Plastics Int. 14, May (1984) 6, pp. 74, 76, 78.
"Zircoaluminates strengthen premium ranges of chemical coupling agents" L.B. Cohen, Plastics Engineering 39 (1983) 11, pp. 29–32.
Derwent Abstract Record for JP08245872.

*Primary Examiner*—Jeffrey B. Robertson

(57) ABSTRACT

A curable composition includes a functionalized poly (arylene ether); an alkenyl aromatic monomer; an acryloyl monomer; and a polymeric additive having a glass transition temperature less than or equal to 100° C. and a Young's modulus less than or equal to 1000 megapascals at 25° C. The polymeric additive is soluble in the combined functionalized poly(arylene ether), alkenyl aromatic monomer, and acryloyl monomer at a temperature less than or equal to 50° C. The composition exhibits low shrinkage on curing and improved surface smoothness. It is useful, for example, in the manufacture of automotive body panels.

58 Claims, No Drawings

U.S. PATENT DOCUMENTS

| | | | |
|---|---|---|---|
| 3,883,612 A | 5/1975 | Pratt et al. | |
| 3,936,414 A | 2/1976 | Wright et al. | |
| 3,996,195 A | 12/1976 | Sato et al. | |
| 4,048,143 A | 9/1977 | Hay et al. | |
| 4,081,418 A | 3/1978 | Barua et al. | |
| 4,148,843 A | 4/1979 | Goossens | |
| 4,158,736 A | 6/1979 | Lewis et al. | |
| 4,165,422 A | 8/1979 | White et al. | |
| 4,230,767 A | 10/1980 | Isaka et al. | |
| 4,257,936 A | 3/1981 | Matsumoto et al. | |
| 4,298,718 A | 11/1981 | Mayr et al. | |
| 4,327,013 A | 4/1982 | Peters | |
| 4,446,272 A * | 5/1984 | Fukuda et al. | 524/465 |
| 4,521,491 A | 6/1985 | Oizumi et al. | |
| 4,544,717 A | 10/1985 | Mayr et al. | |
| 4,562,243 A | 12/1985 | Percec | |
| 4,565,684 A | 1/1986 | Tibbetts et al. | |
| 4,572,813 A | 2/1986 | Arakawa | |
| 4,604,415 A * | 8/1986 | Hambrecht et al. | 524/140 |
| 4,604,417 A | 8/1986 | Cottman | |
| 4,634,742 A | 1/1987 | Percec | |
| 4,663,230 A | 5/1987 | Tennent | |
| 4,663,402 A | 5/1987 | Percec et al. | |
| 4,665,137 A | 5/1987 | Percec | |
| 4,677,185 A | 6/1987 | Heitz et al. | |
| 4,701,514 A | 10/1987 | Percec | |
| 4,755,566 A * | 7/1988 | Yates, III | 525/391 |
| 4,760,118 A | 7/1988 | White et al. | |
| H521 H | 9/1988 | Fan | |
| 4,794,096 A | 12/1988 | Ewen | |
| 4,806,601 A | 2/1989 | Percec | |
| 4,816,289 A | 3/1989 | Komatsu et al. | |
| 4,816,515 A | 3/1989 | Weiss | |
| 4,855,351 A | 8/1989 | Stein | |
| 4,871,816 A | 10/1989 | Percec et al. | |
| 4,874,826 A | 10/1989 | Sakamoto et al. | |
| 4,876,078 A | 10/1989 | Arakawa et al. | |
| 4,888,397 A | 12/1989 | van der Meer et al. | |
| 4,892,851 A | 1/1990 | Ewen et al. | |
| 4,923,932 A | 5/1990 | Katayose et al. | |
| 4,975,403 A | 12/1990 | Ewen | |
| 5,024,818 A | 6/1991 | Tibbetts et al. | |
| 5,039,781 A | 8/1991 | Neugebauer et al. | |
| 5,053,496 A | 10/1991 | Bertsch et al. | |
| 5,061,602 A | 10/1991 | Koch et al. | |
| 5,071,922 A | 12/1991 | Nelissen et al. | |
| 5,079,268 A | 1/1992 | Nelissen et al. | |
| 5,091,480 A | 2/1992 | Percec | |
| 5,157,077 A | 10/1992 | Siebert et al. | |
| 5,165,909 A | 11/1992 | Tennent et al. | |
| 5,171,761 A | 12/1992 | Penco et al. | |
| 5,198,510 A | 3/1993 | Siebert et al. | |
| 5,213,886 A | 5/1993 | Chao et al. | |
| 5,218,030 A | 6/1993 | Katayose et al. | |
| 5,219,951 A | 6/1993 | Nelissen et al. | |
| 5,241,015 A | 8/1993 | Chou | |
| 5,243,002 A | 9/1993 | Razavi | |
| 5,286,790 A * | 2/1994 | Laughner | 525/67 |
| 5,304,600 A | 4/1994 | Nelissen et al. | |
| 5,308,811 A | 5/1994 | Suga et al. | |
| 5,310,820 A | 5/1994 | Nelissen et al. | |
| 5,338,796 A | 8/1994 | Vianello et al. | |
| 5,352,745 A | 10/1994 | Katayose et al. | |
| 5,405,896 A | 4/1995 | Fujiki et al. | |
| 5,407,972 A | 4/1995 | Smith et al. | |
| 5,444,134 A | 8/1995 | Matsumoto | |
| 5,539,030 A * | 7/1996 | Laughner | 524/141 |
| 5,589,152 A | 12/1996 | Tennent et al. | |
| 5,591,382 A | 1/1997 | Nahass et al. | |
| 5,612,425 A | 3/1997 | Weber et al. | |
| 5,719,233 A * | 2/1998 | Gallucci et al. | 525/92 B |
| 5,834,565 A | 11/1998 | Tracy et al. | |
| 5,851,646 A | 12/1998 | Takahashi et al. | |
| 5,965,663 A | 10/1999 | Hayase | |
| 6,022,550 A | 2/2000 | Watanabe | |
| 6,090,872 A | 7/2000 | Albe et al. | |
| 6,306,963 B1 | 10/2001 | Lane et al. | |
| 6,352,782 B2 | 3/2002 | Yeager et al. | |
| 6,362,263 B1 * | 3/2002 | Brown et al. | 524/267 |
| 6,384,176 B1 | 5/2002 | Braat et al. | |
| 2001/0049046 A1 | 12/2001 | Butler | |
| 2001/0053820 A1 | 12/2001 | Yeager et al. | |
| 2002/0005508 A1 | 1/2002 | Butler et al. | |
| 2002/0028337 A1 | 3/2002 | Yeager et al. | |
| 2002/0077447 A1 | 6/2002 | Hwang et al. | |
| 2003/0215588 A1 * | 11/2003 | Yeager et al. | 428/35.7 |
| 2004/0146692 A1 | 7/2004 | Inoue et al. | |

* cited by examiner

THERMOSET COMPOSITION, METHOD, AND ARTICLE

CROSS REFERENCE TO RELATED APPLICATIONS

This application is a continuation-in-part of U.S. application Ser. No. 09/682,057 filed Jul. 16, 2001, now U.S. Pat. No. 6,607,704, which is a continuation-in-part of U.S. application Ser. No. 09/452,733 filed Dec. 1, 1999, now U.S. Pat. No. 6,352,782 B2.

BACKGROUND

Thermoset molding compositions known in the art are generally thermosetting resins containing inorganic fillers and/or fibers. Upon heating, thermoset monomers initially exhibit viscosities low enough to allow for melt processing and molding of an article from the filled monomer composition. Upon further heating, the thermosetting monomers react and cure to form hard resins with high stiffness.

One industrial use of thermoset compositions is the molding of automotive body panels. These panels preferably exhibit high dimensional stability and a smooth as-molded surface. It is also preferred that the dimensions of the molded parts conform closely to those of the molds used to prepare them.

Thermoset compositions based on unsaturated polyester resins and styrene are known to exhibit reduced shrinkage and improved surface properties when they incorporate a so-called low-profile additive, such as a polymethacrylate copolymer. See, for example, V. A. Pattison et al. *J. Appl Poly. Sci*, volume 18, pages 2763–2771 (1974). Although known low-profile additives improve the performance of the polyester thermosets, there is a need for compositions exhibiting further improvements, particularly in surface characteristics.

U.S. Pat. No. 6,352,782 to Yeager et al. describes thermoset compositions comprising poly(arylene ether) resins that have been capped with ethylenically unsaturated groups. These compositions exhibit desirable properties including high glass transition temperatures and low coefficients of thermal expansion. However, low-profile additives known for polyester thermosets are ineffective in the poly (arylene ether)-containing compositions.

There remains a need for thermoset compositions exhibiting reduced shrinkage on molding and improved surface characteristics.

BRIEF SUMMARY

The above-described and other drawbacks are alleviated by a curable composition, comprising: a functionalized poly(arylene ether); an alkenyl aromatic monomer; an acryloyl monomer; and a polymeric additive having a glass transition temperature less than or equal to 100° C. and a Young's modulus less than or equal to 1000 megapascals (MPa) at 25° C.; wherein the polymeric additive is soluble in the combined functionalized poly(arylene ether), alkenyl aromatic monomer, and acryloyl monomer at a temperature less than or equal to 50° C.

Another embodiment is a curable composition, comprising: a functionalized poly (arylene ether); an alkenyl aromatic monomer; an acryloyl monomer; and a polymeric additive selected from the group consisting of a polystyrene, a poly(styrene-maleic anhydride), a poly(styrene-methyl methacrylate), a polybutene, a poly(ethylene-butylene), a poly(vinyl ether), a poly(vinyl alkanoate) wherein the alkanoate group has at least three carbons, and combinations comprising at least one of the foregoing polymeric additives.

Other embodiments, including a method of preparing a curable composition, a cured composition comprising the reaction product of the curable composition, and articles comprising the cured composition, are described below.

DETAILED DESCRIPTION OF THE PREFERRED EMBODIMENTS

One embodiment is a curable composition, comprising: a functionalized poly (arylene ether); an alkenyl aromatic monomer; an acryloyl monomer; and a polymeric additive having a glass transition temperature less than or equal to 100° C. and a Young's modulus less than or equal to 1000 MPa at 25° C.; wherein the polymeric additive is soluble in the combined functionalized poly(arylene ether), alkenyl aromatic monomer, and acryloyl monomer at a temperature less than or equal to 50° C.

Another embodiment is a curable composition, comprising: functionalized poly (arylene ether); an alkenyl aromatic monomer; an acryloyl monomer; and a polymeric additive selected from the group consisting of a polystyrene, a poly(styrene-maleic anhydride), a poly(styrene-methyl methacrylate), a polybutene, a poly(ethylene-butylene), a poly(vinyl ether), a poly(vinyl alkanoate) wherein the alkanoate group has at least three carbons, and combinations comprising at least one of the foregoing polymeric additives.

After extensive investigations, the present inventors have characterized and identified polymeric additives that reduce shrinkage on molding and improve as-molded surface characteristics of poly(arylene ether)-containing thermoset compositions.

The composition comprises a functionalized poly(arylene ether), which may be a capped poly(arylene ether) or a ring-functionalized poly(arylene ether), each of which is defined below.

The functionalized poly(arylene ether) may be a capped poly(arylene ether). A capped poly(arylene ether) is defined herein as a poly(arylene ether) in which at least 50%, preferably at least 75%, more preferably at least 90%, yet more preferably at least 95%, even more preferably at least 99%, of the free hydroxyl groups present in the corresponding uncapped poly(arylene ether) have been functionalized by reaction with a capping agent.

The capped poly(arylene ether) may be represented by the structure $$Q(J-K)_y$$

wherein Q is the residuum of a monohydric, dihydric, or polyhydric phenol, preferably the residuum of a monohydric or dihydric phenol, more preferably the residuum of a monohydric phenol; y is 1 to 100; J comprises repeating structural units having the formula

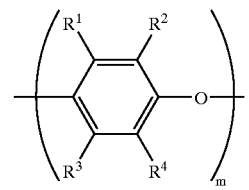

wherein m is 1 to about 200, preferably 2 to about 200, and $R^1$–$R^4$ are each independently hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_2$–$C_{12}$ halohydrocarbonoxy wherein at least two carbon atoms separate the halogen and oxygen atoms, or the like; and K is a capping group produced by reaction of a phenolic hydroxyl group on the poly (arylene ether) with a capping reagent. The resulting capping group may be

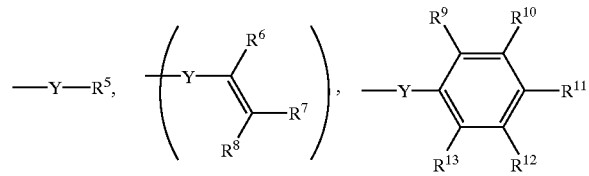

or the like, wherein $R^5$ is $C_1$–$C_{12}$ alkyl, or the like; $R^6$–$R^8$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_7$–$C_{18}$ alkyl-substituted aryloxycarbonyl, $C_7$–$C_{18}$ aryl-substituted alkoxycarbonyl, nitrile, formyl, carboxylate, imidate, thiocarboxylate, or the like; $R^9$–$R^{13}$ are each independently hydrogen, halogen, $C_1$–$C_{12}$ alkyl, hydroxy, amino, or the like; and wherein Y is a divalent group such as

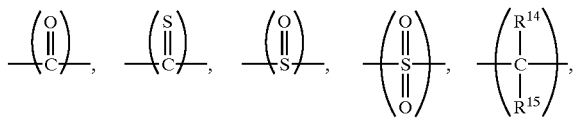

or the like, wherein $R^{14}$ and $R^{15}$ are each independently hydrogen, $C_1$–$C_{12}$ alkyl, or the like.

In one embodiment, Q is the residuum of a phenol, including polyfunctional phenols, and includes radicals of the structure

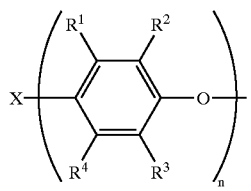

wherein $R^1$–$R^4$ are each independently hydrogen, halogen, primary or secondary $C_1$–$C_{12}$ alkyl, $C_1$–$C_{12}$ alkenyl, $C_1$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ aminoalkyl, $C_1$–$C_{12}$ hydrocarbonoxy, $C_1$–$C_{12}$ halohydrocarbonoxy wherein at least two carbon atoms separate the halogen and oxygen atoms, or the like; X may be hydrogen, $C_1$–$C_{12}$ alkyl, $C_6$–$C_{18}$ aryl, $C_7$–$C_{18}$ alkyl-substituted aryl, $C_7$–$C_{18}$ aryl-substituted alkyl, or any of the foregoing hydrocarbon groups containing at least one substituent such as carboxylic acid, aldehyde, alcohol, amino radicals, or the like; X also may be sulfur, sulfonyl, sulfuryl, oxygen, or other such bridging group having a valence of 2 or greater to result in various bis- or higher polyphenols; y and n are each independently 1 to about 100, preferably 1 to 3, and more preferably about 1 to 2; in a preferred embodiment, y=n. Q may also be the residuum of a diphenol, such as 2,2',6,6'-tetramethyl-4,4'-diphenol.

In one embodiment, the capped poly(arylene ether) is produced by capping a poly (arylene ether) consisting essentially of the polymerization product of at least one monohydric phenol having the structure

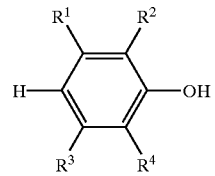

wherein $R^1$–$R^4$ are each independently hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_2$–$C_{12}$ halohydrocarbonoxy wherein at least two carbon atoms separate the halogen and oxygen atoms, or the like. Suitable monohydric phenols include those described in U.S. Pat. No. 3,306,875 to Hay, and highly preferred monohydric phenols include 2,6-dimethylphenol and 2,3,6-trimethylphenol. The poly(arylene ether) may be a copolymer of at least two monohydric phenols, such as 2,6-dimethylphenol and 2,3,6-trimethylphenol.

In a preferred embodiment, the capped poly(arylene ether) comprises at least one capping group having the structure

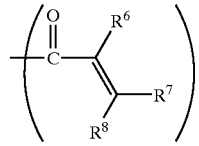

wherein $R^6$–$R^8$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_7$–$C_{18}$ alkyl-substituted aryloxycarbonyl, $C_7$–$C_{18}$ aryl-substituted alkoxycarbonyl, nitrile, formyl, carboxylate, imidate, thiocarboxylate, or the like. Highly preferred capping groups include acrylate ($R^6$=$R^7$=$R^8$=hydrogen) and methacrylate ($R^6$=methyl, $R^7$=$R^8$=hydrogen).

In another preferred embodiment, the capped poly (arylene ether) comprises at least one capping group having the structure

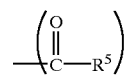

wherein $R^5$ is $C_1$–$C_{12}$ alkyl, preferably $C_1$–$C_6$ alkyl, more preferably methyl, ethyl, or isopropyl. The present inventors have surprisingly found that the advantageous properties of their invention can be achieved even when the capped poly(arylene ether) lacks a polymerizable function such as a carbon-carbon double bond.

In yet another preferred embodiment, the capped poly (arylene ether) comprises at least one capping group having the structure

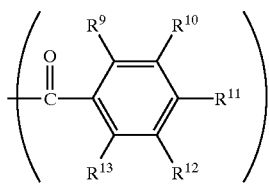

wherein $R^9$–$R^{13}$ are each independently hydrogen, halogen, $C_1$–$C_{12}$ alkyl, hydroxy, amino, or the like. Preferred capping groups of this type include salicylate ($R^9$=hydroxy, $R^{10}$–$R^{13}$=hydrogen).

In still another preferred embodiment, the capped poly (arylene ether) comprises at least one capping group having the structure

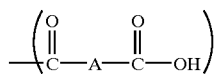

wherein A is a saturated or unsaturated $C_2$–$C_{12}$ divalent hydrocarbon group such as, for example, ethylene, 1,2-propylene, 1,3-propylene, 2-methyl-1,3-propylene, 2,2-dimethyl-1,3-propylene, 1,2-butylene, 1,3-butylene, 1,4-butylene, 2-methyl-1,4-butylene, 2,2-dimethyl-1,4-butylene, 2,3-dimethyl-1,4-butylene, vinylene (—CH═CH—), 1,2-phenylene, and the like. These capped poly(arylene ether) resins may conveniently be prepared, for example, by reaction of an uncapped poly(arylene ether) with a cyclic anhydride capping agent. Such cyclic anhydride capping agents include, for example, maleic anhydride, succinic anhydride, glutaric anhydride, adipic anhydride, phthalic anhydride, and the like.

There is no particular limitation on the method by which the capped poly(arylene ether) is prepared. The capped poly(arylene ether) may be formed by the reaction of an uncapped poly(arylene ether) with a capping agent. Capping agents include compounds known in the literature to react with phenolic groups. Such compounds include both monomers and polymers containing, for example, anhydride, acid chloride, epoxy, carbonate, ester, isocyanate, cyanate ester, or alkyl halide radicals. Capping agents are not limited to organic compounds as, for example, phosphorus and sulfur based capping agents also are included. Examples of capping agents include, for example, acetic anhydride, succinic anhydride, maleic anhydride, salicylic anhydride, polyesters comprising salicylate units, homopolyesters of salicylic acid, acrylic anhydride, methacrylic anhydride, glycidyl acrylate, glycidyl methacrylate, acetyl chloride, benzoyl chloride, diphenyl carbonates such as di(4-nitrophenyl) carbonate, acryloyl esters, methacryloyl esters, acetyl esters, phenylisocyanate, 3-isopropenyl-alpha,alpha-dimethylphenylisocyanate, cyanatobenzene, 2,2-bis(4-cyanatophenyl)propane), 3-(alpha-chloromethyl)styrene, 4-(alpha-chloromethyl) styrene, allyl bromide, and the like, carbonate and substituted derivatives thereof, and mixtures thereof. These and other methods of forming capped poly (arylene ether)s are described, for example, in U.S. Pat. No. 3,375,228 to Holoch et al.; U.S. Pat. No. 4,148,843 to Goossens; U.S. Pat. Nos. 4,562,243, 4,663,402, 4,665,137, and 5,091,480 to Percec et al.; U.S. Pat. Nos. 5,071,922, 5,079,268, 5,304,600, and 5,310,820 to Nelissen et al.; U.S. Pat. No. 5,338,796 to Vianello et al.; and European Patent No. 261,574 B1 to Peters et al.

In a preferred embodiment, the capped poly(arylene ether) may be prepared by reaction of an uncapped poly (arylene ether) with an anhydride in an alkenyl aromatic monomer as solvent. This approach has the advantage of generating the capped poly (arylene ether) in a form that can be immediately blended with other components to form a curable composition; using this method, no isolation of the capped poly (arylene ether) or removal of unwanted solvents or reagents is required.

A capping catalyst may be employed in the reaction of an uncapped poly(arylene ether) with an anhydride. Examples of such compounds include those known to the art that are capable of catalyzing condensation of phenols with the capping agents described above. Useful materials are basic compounds including, for example, basic compound hydroxide salts such as sodium hydroxide, potassium hydroxide, tetraalkylammonium hydroxides, and the like; tertiary alkylamines such as tributyl amine, triethylamine, dimethylbenzylamine, dimethylbutylamine and the like; tertiary mixed alkyl-arylamines and substituted derivatives thereof such as N,N-dimethylaniline; heterocyclic amines such as imidazoles, pyridines, and substituted derivatives thereof such as 2-methylimidazole, 2-vinylimidazole, 4-(dimethylamino) pyridine, 4-(1-pyrrolino)pyridine, 4-(1-piperidino)pyridine, 2-vinylpyridine, 3-vinylpyridine, 4-vinylpyridine, and the like. Also useful are organometallic salts such as, for example, tin and zinc salts known to catalyze the condensation of, for example, isocyanates or cyanate esters with phenols. The organometallic salts useful in this regard are known to the art in numerous publications and patents well known to those skilled in this art.

The functionalized poly(arylene ether) may be a ring-functionalized poly(arylene ether). A ring-functionalized poly(arylene ether) is defined herein as a poly(arylene ether) comprising repeating structural units of the formula

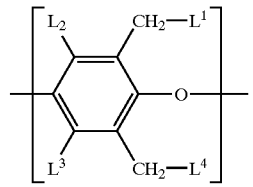

wherein each $L^1$–$L^4$ is independently hydrogen, an alkenyl group, or an alkynyl group; wherein the alkenyl group is represented by

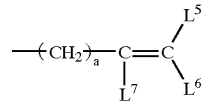

wherein $L^5$–$L^7$ are independently hydrogen or methyl, and a is an integer from 1 to 4; wherein the alkynyl group is represented by

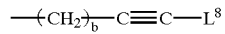

wherein $L^8$ is hydrogen, methyl, or ethyl, and b is an integer from 1 to 4; and wherein about 0.02 mole percent to about 25 mole percent of the total $L^1$–$L^4$ substituents in the ring-functionalized poly(arylene ether) are alkenyl and/or alkynyl groups. Within this range, it may be preferred to have at least about 0.1 mole percent, more preferably at least about 0.5 mole percent, alkenyl and/or alkynyl groups. Also within this range, it may be preferred to have up to about 15 mole percent, more preferably up to about 10 mole percent, alkenyl and/or alkynyl groups.

The ring-functionalized poly(arylene ether) may be prepared according to known methods. For example, an unfunctionalized poly(arylene ether) such as poly(2,6-dimethyl-1,4-phenylene ether) may be metalized with a reagent such as n-butyl lithium and subsequently reacted with an alkenyl halide such as allyl bromide and/or an alkynyl halide such as propargyl bromide. This and other methods for preparation of ring-functionalized poly(arylene ether) resins are described, for example, in U.S. Pat. No. 4,923,932 to Katayose et al.

It will be understood that the poly(arylene ether)s described herein as "uncapped" or "unfunctionalized" comprise repeating structural units having the formula

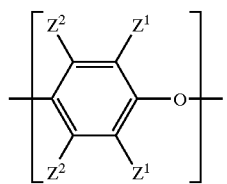

wherein for each structural unit, each $Z^1$ is independently hydrogen, halogen, primary or secondary $C_1$–$C_{12}$ alkyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms, or the like; and each $Z^2$ is independently halogen, primary or secondary $C_1$–$C_{12}$ alkyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, $C_1$–$C_{12}$ halohydrocarbonoxy wherein at least two carbon atoms separate the halogen and oxygen atoms, or the like. Preferably, each $Z^1$ is $C_{1-4}$ alkyl, and each $Z^2$ is hydrogen or methyl.

There is no particular limitation on the molecular weight or intrinsic viscosity of the functionalized poly(arylene ether). In one embodiment, the composition may comprise a functionalized poly(arylene ether) having a number average molecular weight up to about 10,000 atomic mass units (AMU), preferably up to about 5,000 AMU, more preferably up to about 3,000 AMU. Such a functionalized poly(arylene ether) may be useful in preparing and processing the composition by reducing its viscosity.

In another embodiment, the composition may comprise a functionalized poly (arylene ether) having an intrinsic viscosity of about 0.08 to about 0.30 deciliters per gram (dL/g), preferably about 0.12 to about 0.30 dL/g, more preferably about 0.20 to about 0.30 dL/g as measured in chloroform at 25° C. Generally, the intrinsic viscosity of a functionalized poly(arylene ether) will vary insignificantly from the intrinsic viscosity of the corresponding unfunctionalized poly (arylene ether). Specifically, the intrinsic viscosity of a functionalized poly(arylene ether) will generally be within 10% of that of the unfunctionalized poly(arylene ether). These intrinsic viscosities may correspond approximately to number average molecular weights of about 5,000 to about 25,000 AMU. Within this range, a number average molecular weight of at least about 8,000 AMU may be preferred, and a number average molecular weight of at least about 10,000 AMU may be more preferred. Also within this range, a number average molecular weight up to about 20,000 AMU may be preferred. Such a functionalized poly(arylene ether) may provide the composition with a desirable balance of toughness and processability. It is expressly contemplated to employ blends of at least two functionalized poly(arylene ether)s having different molecular weights and intrinsic viscosities.

In a preferred embodiment, the functionalized poly (arylene ether) is substantially free of amino substituents, including alkylamino and dialkylamino substituents, wherein substantially free means that the functionalized poly(arylene ether) contains less than about 300 micrograms, preferably less than about 100 micrograms, of atomic nitrogen per gram of functionalized poly(arylene ether). Although many poly (arylene ether)s are synthesized by processes that result in the incorporation of amino substituents, the present inventors have found that thermoset curing rates are increased when the functionalized poly (arylene ether) is substantially free of amino substituents. Poly(arylene ether)s substantially free of amino substituents may be synthesized directly or generated by heating aminosubstituted poly(arylene ether)s to at least about 200° C. Alternatively, if the functionalized poly(arylene ether) contains amino substituents, it may be desirable to cure the composition at a temperature less than about 200° C.

The composition may comprise a blend of at least two functionalized poly(arylene ethers). Such blends may be prepared from individually prepared and isolated functionalized poly(arylene ethers). Alternatively, such blends may be prepared by reacting a single poly(arylene ether) with at least two functionalizing agents. For example, a poly (arylene ether) may be reacted with two capping agents, or a poly (arylene ether) may be metalized and reacted with two unsaturated alkylating agents. In another alternative, a mixture of at least two poly(arylene ether) resins may be reacted with a single functionalizing agent.

The composition may comprise the functionalized poly (arylene ether) in an amount of comprising about 10 to about 90 parts by weight per 100 parts by weight total of the functionalized poly(arylene ether), the alkenyl aromatic monomer, the acryloyl monomer, and the polymeric additive. Within this range, it may be preferred to use a functionalized poly(arylene ether) amount of at least about 20 parts by weight, more preferably at least about 30 parts by weight. Also within this range, it may be preferred to use a functionalized poly(arylene ether) amount of up to about 80 parts by weight, more preferably up to about 70 parts by weight, yet more preferably up to about 60 parts by weight, still more preferably up to about 50 parts by weight.

The composition further comprises an alkenyl aromatic monomer. The alkenyl aromatic monomer may have the structure

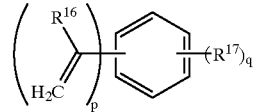

wherein each $R^{16}$ is independently hydrogen, $C_1$–$C_{12}$ alkyl, $C_2$–$C_{12}$ alkenyl, $C_2$–$C_{12}$ alkynyl, $C_6$–$C_{18}$ aryl, or the like; each $R^{17}$ is independently halogen, $C_1$–$C_{12}$ alkyl, $C_1$–$C_{12}$ alkoxyl, $C_6$–$C_{18}$ aryl, or the like; p is 1 to 4; and q is 0 to 5. When p=1, the alkenyl aromatic monomer is termed a monofunctional alkenyl aromatic monomer; when p=2–4, the alkenyl aromatic monomer is termed a polyfunctional alkenyl aromatic monomer. Suitable alkenyl aromatic monomers include styrene, alpha-methylstyrene, alpha-ethylstyrene, alpha-isopropylstyrene, alpha-tertiary-butylstyrene, alpha-phenylstyrene, and the like; halogenated styrenes such as chlorostyrene, dichlorostyrene, trichlorostyrene, bromostyrene, dibromostyrene, tribromostyrene, fluorostyrene, difluorostyrene, trifluorostyrene, tetrafluorostyrene, pentafluorostyrene, and the like; halogenated alkylstyrenes such as chloromethylstyrene, and the like; alkoxystyrenes such as methoxystyrene, ethoxystyrene, and the like; polyfunctional alkenyl aromatic monomers such as 1,2-divinylbenzene, 1,3-divinylbenzene, 1,4-divinylbenzene, trivinylbenzenes, 1,3-diisopropenylbenzene, 1,4-diisopropenylbenzene, and the like; and mixtures comprising at least one of the foregoing alkenyl aromatic monomers. In the foregoing substituted styrenes for which no substituent position is specified, the substituents may occupy any free position on the aromatic ring.

Preferred alkenyl aromatic monomers include styrene, alpha-methylstyrene, 2-methylstyrene, 3-methylstyrene, 4-methylstyrene, 2-t-butylstyrene, 3-t-butylstyrene, 4-t-butylstyrene, 1,3-divinylbenzene, 1,4-divinylbenzene, 1,3-diisopropenylbenzene, 1,4-diisopropenylbenzene, and the like, and mixtures comprising at least one of the foregoing alkenyl aromatic monomers. Preferred alkenyl aromatic monomers further include styrenes having from 1 to 5 halogen substituents on the aromatic ring, and mixtures comprising at least one such halogenated styrene.

Alkenyl aromatic monomers are commercially available from numerous sources. They may also be prepared by methods known in the art.

The composition may comprise the alkenyl aromatic monomer in an amount of about 10 to about 90 parts by weight per 100 parts by weight total of the functionalized poly(arylene ether), the alkenyl aromatic monomer, the acryloyl monomer, and the polymeric additive. Within this range, it may be preferred to use an alkenyl aromatic monomer amount of at least about 20 parts by weight, more preferably at least about 30 parts by weight. Also within this range, it may be preferred to use an alkenyl aromatic monomer amount of up to about 80 parts by weight, more preferably up to about 70 parts by weight, yet more preferably up to about 60 parts by weight, still more preferably up to about 50 parts by weight.

The composition further comprises an acryloyl monomer. The acryloyl monomer comprises at least one acryloyl moiety having the structure

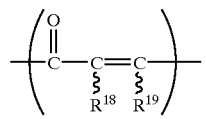

wherein $R^{18}$ and $R^{19}$ are each independently hydrogen, $C_1$–$C_{12}$ alkyl, or the like; and wherein $R^{18}$ and $R^{19}$ may be disposed either cis or trans about the carbon-carbon double bond. Preferably, $R^{18}$ and $R^{19}$ are each independently hydrogen or methyl. In one embodiment, the acryloyl monomer comprises at least two acryloyl moieties having the above structure and is termed a polyfunctional acryloyl monomer. In another embodiment, the acryloyl monomer comprises at least three acryloyl moieties having the above structure.

In one embodiment, the acryloyl monomer comprises at least one acryloyl moiety having the structure

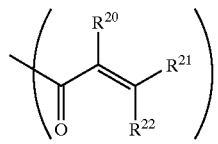

wherein $R^{20}$–$R^{22}$ are each independently hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, thiocarboxylate, or the like. Preferably, $R^{20}$–$R^{22}$ are each independently hydrogen or methyl. In one embodiment, the acryloyl monomer comprises at least two acryloyl moieties having the structure above. In another embodiment, the acryloyl monomer comprises at least three acryloyl moieties having the structure above.

Many additional suitable acryloyl monomers are described in U.S. Published application Ser. No. 2001/0053820 A1 to Yeager et al.

In a preferred embodiment, the acryloyl monomer may include compounds having at least two acryloyl moieties per molecule, more preferably at least three acryloyl moieties per molecule. Illustrative examples include compounds produced by condensation of an acrylic or methacrylic acid with a di-epoxide, such as bisphenol-A diglycidyl ether, butanediol diglycidyl ether, or neopenylene glycol dimethacrylate. Specific examples include 1,4-butanediol diglycidylether di(meth)acrylate, bisphenol A diglycidylether dimethacrylate, and neopentylglycol diglycidylether di(meth)acrylate, and the like. Also included as acryloyl monomers are the condensation of reactive acrylate or methacrylate compounds with alcohols or amines to produce the resulting polyfunctional acrylates or polyfunctional acrylamides. Examples include N,N-bis(2-hydroxyethyl)(meth)acrylamide, methylenebis((meth)acrylamide), 1,6-hexamethylenebis((meth)acrylamide), diethylenetriamine tris((meth)acrylamide), bis (gamma-((meth)acrylamide)propoxy) ethane, beta-((meth)acrylamide) ethylacrylate, ethylene glycol di((meth)acrylate)), diethylene glycol di(meth)acrylate, tetraethylene glycol di(meth)acrylateglycerol di(meth)acrylate, glycerol tri(meth)acrylate, 1,3-propylene glycol di(meth)acrylate, dipropyleneglycol di(meth)acrylate, 1,4-butanediol di(meth)acrylate, 1,2,4-butanetriol tri(meth)acrylate, 1,6-hexanedioldi(meth)acrylate, 1,4-cyclohexanediol di(meth)acrylate, 1,4-benzenediol di(meth)acrylate, pentaerythritoltetra(meth)acrylate, 1,5-pentanediol di(meth)acrylate, trimethylolpropane di(meth)acrylate, trimethylolpropane tri(meth)acrylate), 1,3,5-triacryloylhexahydro-1,3,5-triazine, 2,2-bis(4-(2-(meth)acryloxyethoxy)phenyl) propane, 2,2-bis(4-(2-(meth)acryloxyethoxy)-3,5-dibromophenyl)propane, 2,2-bis ((4-(meth)acryloxy) phenyl)propane, 2,2-bis((4-(meth)acryloxy)-3,5-dibromophenyl) propane, and the like, and mixtures comprising at least one of the foregoing acryloyl monomers. It will be understood that the fragment "(meth)acryl-" denotes either "acryl-" or "methacryl-".

Highly preferred acryloyl monomers include trimethylolpropane tri(meth)acrylate, 1,6-hexanediol di(meth)acrylate, ethylene glycol di(meth)acrylate, propylene glycol di (meth) acrylate, cyclohexanedimethanol di(meth)acrylate, butanedioldi(meth)acrylate, diethylene glycol di(meth) acrylate, triethylene glycol di(meth)acrylate, isobornyl (meth) acrylate, cyclohexyl(meth)acrylate, butyl(meth) acrylate, methyl(meth)acrylate, dibutyl fumarate, dibutyl maleate, glycidyl(meth)acrylate, ethyl(meth)acrylate, 2-ethylhexyl(meth)acrylate, hexyl(meth)acrylate, lauryl (meth)acrylate, stearyl(meth)acrylate, decyl(meth)acrylate, octyl(meth)acrylate, and the like, and mixtures comprising at least one of the foregoing acryloyl monomers.

Acryloyl monomers are commercially available from numerous sources. They may also be prepared by methods known in the art.

The composition may comprise the acryloyl monomer in an amount of about 1 to about 50 parts by weight per 100 parts by weight total of the functionalized poly (arylene ether), the alkenyl aromatic monomer, the acryloyl monomer, and the polymeric additive. Within this range, it may be preferred to use an acryloyl monomer amount of at least about 5 parts by weight, more preferably at least about 10 parts by weight. Also within this range, it may be preferred to use an acryloyl monomer amount of up to about 40 parts by weight, more preferably up to about 30 parts by weight, yet more preferably up to 20 parts by weight.

In one embodiment, in addition to the poly(arylene ether), the poly(alkenyl aromatic) compound, and the acryloyl compound, the composition further comprises a polymeric additive having a glass transition temperature less than or equal to 100° C. and a Young's modulus less than or equal to 1000 MPa at 25° C.; wherein the polymeric additive is soluble in the combined functionalized poly(arylene ether), alkenyl aromatic monomer, and acryloyl monomer at a temperature less than or equal to 50° C.

It may be preferred that the polymeric additive is soluble in the combined functionalized poly(arylene ether), alkenyl aromatic monomer, and acryloyl monomer at a temperature less than or equal to 40° C., more preferably less than or equal to 30° C., still more preferably less than or equal to 20° C. Another way of describing the solubility limitation is that the functionalized poly(arylene ether), the alkenyl aromatic monomer, the acryloyl monomer, and the polymeric additive are capable of collectively forming a solution, preferably a substantially homogeneous solution, at a temperature less than or equal to 50° C. By substantially homogeneous solution, it is meant that the solution contains less than 0.1% by weight of particles greater than 1 micrometer in any dimension. The solution preferably contains less than 0.01% by weight of particles greater than 1 micrometer in any dimension.

The polymeric additive has a glass transition temperature less than or equal to 100° C., preferably less than or equal to 75° C., more preferably less than or equal to 50° C., even more preferably less than or equal to 25° C., even more preferably less than or equal to 0° C.

The polymeric additive has a Young's modulus less than or equal to 1000 MPa at 25° C., preferably less than or equal to 100 MPa at 25° C., more preferably less than or equal to 10 MPa at 25° C.

In one embodiment, the polymeric additive is selected from the group consisting of poly(alkenyl hydrocarbon)s, poly(alkyl(meth)acrylate)s, poly(vinyl ester)s, polysiloxanes, and combinations comprising at least one of the foregoing polymeric additives.

The polymeric additive may comprise a poly(alkenyl hydrocarbon). Suitable poly (alkenyl hydrocarbon)s include those comprising at least 80 weight percent, preferably at least 90 weight percent, more preferably at least 95 weight percent, still more preferably at least 98 weight percent, of repeating structural units having the formula

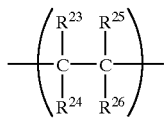

wherein $R^{23}$–$R^{26}$ are each independently hydrogen, $C_1$–$C_{12}$ alkyl, $C_2$–$C_{12}$ alkenyl, $C_6$–$C_{18}$ aryl, $C_7$–$C_{18}$ aralkyl, or $C_7$–$C_{18}$ alkylaryl. In a preferred embodiment, $R^{23}$–$R^{26}$ are each independently hydrogen, $C_1$–$C_{12}$ alkyl, or $C_2$–$C_{12}$ alkenyl. In one embodiment, the poly(alkenyl hydrocarbon) is free of heteroatoms.

In one embodiment, the poly(alkenyl hydrocarbon) may comprise polybutadiene; polyethylene; polypropylene; polybutene; poly(4-methyl-1-pentene); a block copolymer comprising a first block that is the polymerization product of styrene and/or alpha-methyl styrene and a second block that is the hydrogenated polymerization product of butadiene and/or isoprene; or the like, or a combination comprising at least one of the foregoing polyolefins.

In another embodiment, the poly(alkenyl hydrocarbon) may comprise polyethylenes, polypropylenes, poly(4-methyl-1-pentene)s, polybutadienes, carboxy-terminated polybutadienes, polyisobutenes, polyisoprenes, ethylene-propylene copolymers, ethylene-propylene-diene terpolymers, styrene-butadiene copolymers, styrene-isoprene copolymers, isobutylene-isoprene copolymers, butadiene-isoprene copolymers, or the like, or combinations comprising at least one of the foregoing polyolefins.

Suitable poly(alkenyl hydrocarbon)s may be prepared according to methods well known in the art, such as those described in, for example, U.S. Pat. No. 3,281,383 to Zelinski et al.; U.S. Pat. No. 3,595,942 to Wald et al., U.S. Pat. No. 4,230,767 to Isaka et al., U.S. Pat. No. 4,892,851 Ewen et al., U.S. Pat. No. 4,298,718 to Mayr et al., U.S. Pat. No. 4,544,717 to Mayr et al., U.S. Pat. No. 4,794,096 to Ewen, U.S. Pat. No. 4,975,403 to Ewen, U.S. Pat. No. 5,243,002 to Ravazi, U.S. Pat. No. 5,308,811 to Suga et al., U.S. Pat. No. 5,444,134 to Matsumoto, and U.S. Pat. No. 6,090,872 to Albe et al. Suitable poly(alkenyl hydrocarbon)s may also be obtained from commercial suppliers, including, for example, the poly(ethylene-butylene)s sold by Kraton Polymers as KRATON® L1203 and L2203; and the carboxy-terminated polybutadienes sold by Noveon Solutions as HYCAR® 2000X162 and HYCAR® 1300X31.

In one embodiment, the polymeric additive comprises a poly(alkyl(meth)acrylate). Suitable poly(alkyl(meth)acrylate)s include those comprising at least 80 weight percent, preferably at least about 90 weight percent, more preferably at least about 95 weight percent, still more preferably at least about 98 weight percent, of repeating structural units having the formula

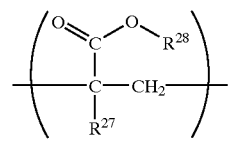

wherein each $R^{27}$ is independently hydrogen or methyl, and each $R^{28}$ is independently $C_1$–$C_{12}$ alkyl. Preferably, $R^{28}$ is $C_2$–$C_6$ alkyl. It will be understood that the prefix "(meth) acryl-" signifies either "acryl-" or "methacryl-".

Suitable poly(alkyl(meth)acrylate)s include, for example, poly(methyl acrylate), poly(methyl methacrylate), poly (ethyl acrylate), poly(ethyl methacrylate), poly(butyl acrylate), poly(butyl methacrylate), poly(2-ethylhexyl acrylate), poly(2-hexyl acrylate), and the like, and copolymers of the corresponding monomers, and combinations comprising at least one of the foregoing poly(alkyl(meth) acrylate)s.

In one embodiment, the poly(alkyl(meth)acrylate) may comprise poly(butyl acrylate), poly(2-hexyl acrylate), or the like, or combinations comprising at least one of the foregoing poly(alkyl(meth)acrylate)s.

Suitable poly(alkyl(meth)acrylate)s may be prepared according to methods known in the art, such as those described in, for example, U.S. Pat. No. 3,476,722 to Schlatzer, U.S. Pat. No. 4,081,418 to Barua et al., and U.S.

Pat. No. 4,158,736 to Lewis et al. Suitable poly(alkyl(meth) acrylate)s may also be obtained from commercial suppliers, including, for example, a poly(methyl acrylate) having a weight average molecular weight of about 40,000 AMU and a glass transition temperature of about 9° C., obtained from Aldrich Chemical as product number 18221-4; a poly(ethyl acrylate) having a weight average molecular weight of about 95,000 AMU and a glass transition temperature of about −23° C., obtained from Aldrich Chemical as product number 18188-9; and poly(butyl acrylate) having a weight average molecular weight of about 99,000 AMU and a glass transition temperature of about −49° C., obtained from Aldrich Chemical as product number 18140-4.

In one embodiment, the polymeric additive comprises a poly(vinyl ester). Suitable poly(vinyl ester)s include those comprising at least 80 weight percent, preferably at least about 90 weight percent, more preferably at least about 95 weight percent, still more preferably at least about 98 weight percent, of repeating structural units having the formula

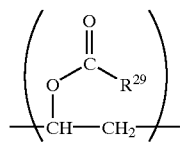

wherein each $R^{29}$ is independently $C_1$–$C_{18}$ alkyl, $C_2$–$C_{18}$ alkenyl, $C_2$–$C_{18}$ alkynyl, $C_6$–$C_{18}$ aryl, $C_7$–$C_{18}$ alkylaryl, $C_7$–$C_{18}$ aralkyl, and the like, wherein each of the foregoing groups may, optionally, be substituted with one or more substituents including epoxy, hydroxy, amino, carboxyl, and the like. In one embodiment, each $R^{29}$ is independently $C_1$–$C_{18}$ alkyl. In one embodiment, each $R^{29}$ is independently $C_3$–$C_{10}$ alkyl, more preferably $C_3$–$C_{10}$ alkyl, still more preferably $C_3$–$C_7$ alkyl. Highly preferred poly(vinyl esters) include poly(vinyl acetate) and copolymers of vinyl acetate and an acid-containing vinyl compound, such as, for example, methacrylic acid or crotonic acid.

The poly(vinyl ester) preferably has a number average molecular weight of about 1,000 to about 150,000 AMU. Within this range, the number average molecular weight may be at least about 5,000 AMU, 7,000 AMU, or 10,000 AMU. Also within this range, the number average molecular weight may be up to about 100,000 AMU, 80,000 AMU, or 50,000 AMU.

Preferred poly(vinyl ester)s include polymers of vinyl propionate, vinyl butyrate, vinyl pentanoate, vinyl pivalate, vinyl hexanoate, vinyl 2-ethylhexanoate, vinyl nonanate, vinyl neononanate, vinyl decanoate, vinyl dodecanoate (vinyl laurate), vinyl tetradecanoate (vinyl myristate), vinyl hexadecanoate (vinyl palmitate), vinyl octadecanoate (vinyl stearate), and the like, and mixtures comprising at least one of the foregoing monomers.

Poly(vinyl ester)s may be prepared by methods known in the art, such as those described in, for example, M. K. Lindemann in G. E. Han, Ed. "Vinyl Polymerization", Volume 1, Dekker: New York (1967), pages 252–255; and K. K. Georgieff et al. *J. Appl. Pol. Sci.*, 1964, volume 8, pages 889–896. Poly(vinyl ester)s may also be obtained commercially from, for example, LP40A, LP90, and NEULON® T from Union Carbide; those sold under the ACRONAL®, ACROSOL, and STYRONAL® tradenames from BASF; DESMOPHEN® A from Bayer; those sold under the tradename SYNOCRYL® from Cray Valley; and those sold under the tradename DEGALAN® from Degussa.

In one embodiment, the polymeric additive is a copolymer comprising at least about 80 weight percent, preferably at least about 90 weight percent, more preferably at least about 95 weight percent, still more preferably at least about 98 weight percent, of the polymerization product of at least a first monomer type and a second monomer type, wherein the first monomer type and the second monomer type are different and independently selected from the group consisting of alkenyl hydrocarbons, alkyl(meth)acrylates, vinyl alkanoates, and nitriles. In other words, the copolymers include two different monomer types (such as an alkenyl hydrocarbon and an alky(meth)acrylate), rather than two monomers of the same type (such as two different alkenyl hydrocarbons).

Preferred copolymers may include, for example, butadiene-acrylonitrile copolymers, carboxy-terminated butadiene-acrylonitrile copolymers, or the like, or combinations comprising at least one of the foregoing copolymers.

In one embodiment, the polymeric additive comprises a butadiene-acrylonitrile copolymer, a polychloroprene butadiene-styrene copolymer, or a combination thereof.

In another embodiment, the polymeric additive may comprise ethylene-vinyl acetate copolymers, ethylene-ethyl acrylate copolymers, acrylonitrile-butadiene-styrene terpolymers, acrylonitrile-butadiene copolymers, methyl methacrylate-butadiene-styrene terpolymers, ethylacrylate-acrylonitrile copolymers, maleic anhydride-grafted polybutadienes, vinyl chloride-vinyl acetate-acrylic acid terpolymers, ethylene-vinyl acetate-acrylic acid terpolymers, or the like, or combinations comprising at least one of the foregoing copolymers.

Suitable copolymers may be prepared according to methods well known in the art, such as those described in, for example, U.S. Pat. No. 5,053,496 to Bertsch et al., U.S. Pat. No. 5,157,077 to Siebert et al., and U.S. Pat. No. 5,198,510 to Siebert et al. Suitable copolymers may also be obtained from commercial suppliers, including, for example, the carboxy-terminated butadiene (90%)/acrylonitrile (10%) copolymer having a carboxyl content acid number of 28, a solubility parameter of 8.14, a number average molecular weight of 3,800 AMU, and a glass transition temperature of −66° C., obtained as HYCAR ® 1300X31 CTBN from Noveon Solutions.

In one embodiment, the polymeric additive comprises a polysiloxane. Suitable polysiloxanes include those having the formula

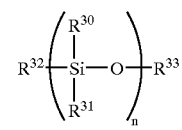

wherein $R^{30}$–$R^{33}$ are each independently hydrogen, hydroxy, $C_1$–$C_{12}$ alkyl, $C_1$–$C_{12}$ alkoxy, $C_2$–$C_{12}$ alkenyl, $C_2$–$C_{12}$ alkynyl, $C_6$–$C_{18}$ aryl, $C_7$–$C_{18}$ alkylaryl, and $C_7$–$C_{18}$ aralkyl, wherein each of the foregoing groups may, optionally, be substituted with one or more substituents selected from the group consisting of epoxy, hydroxy, cyano, amido, amino, and carboxyl; and n is about 3 to about 10,000. Preferably, n is at least 10, more preferably at least 100. In a preferred embodiment, $R^{30}$–$R^{33}$ are each independently $C_1$–$C_{12}$ alkyl or $C_2$–$C_{12}$ alkenyl. Suitable polysiloxanes further include graft and block copolymers formed from a pre-formed polymer or oligomer (e.g., poly(ethylene oxide)s, poly(propylene oxides), poly(butylene oxides), or poly(alkenyl hydrocarbons as described above) and the above described polysiloxane chain through condensation or hydrosilation.

Examples of suitable polysiloxanes include vinyl-terminated polydimethylsiloxanes, vinyl-terminated diphenylsiloxane-dimethylsiloxane copolymers, vinyl-terminated trifluoropropylmethylsiloxane-diphenylsiloxane copolymers, vinyl-terminated diethylsiloxane-dimethylsiloxane copolymers, vinylmethylsiloxane-dimethylsiloxane copolymers, trimethylsiloxane-terminated vinylmethylsiloxane-dimethylsiloxane copolymers, silanol-terminated vinyl methylsiloxane-dimethylsiloxane copolymers, vinyl-terminated vinylsiloxane gums, vinylmethylsiloxane homopolymers, vinylmethoxysiloxane homopolymers, hydride terminated polydimethylsiloxanes, methylhydrosiloxane-dimethylsiloxane copolymers, polymethylhydrosiloxanes, polyethylhydrosiloxanes, silanol-terminated polydimethylsiloxanes, aminopropyl-terminated polydimethylsiloxanes, aminopropylmethylsiloxane-dimethylsiloxane copolymers, polydimethylsiloxane-poly (ethyleneoxide) block copolymers, polydimethylsiloxane poly(propylene oxide-ethylene oxide) copolymers (e.g., with 50–70% poly(propylene oxide-ethylene oxide), cyanopropylmethylsiloxane-dimethylsiloxane copolymers, (N-pyridonepropyl) siloxane-dimethylsiloxane copolymers, epoxypropoxypropyl-terminated polydimethylsiloxanes, epoxycyclohexylethylmethylsiloxane-dimethylsiloxane copolymers, (meth)acryloxypropylmethylsiloxane-dimethylsiloxane copolymers, and the like.

Preferred polysiloxanes include vinyl-terminated polydimethylsiloxanes. Other preferred polysiloxanes include hydroxy-terminated polydimethylsiloxanes. Polysiloxanes may be prepared by methods known in the art, such as those described in, for example, U.S. Pat. No. 3,996,195 to Sato et al., U.S. Pat. No. 4,257,936 to Matsumoto et al., U.S. Pat. No. 4,855,351 to Stein, and U.S. Pat. No. 5,405,896 to Fujiki et al. Polysiloxanes may also be obtained commercially from, for example, GE Silicones, a division of General Electric Company.

In one embodiment, the polysiloxane comprises a methyl silicone optionally substituted with phenyl and/or vinyl groups.

In one embodiment, in addition to the poly(arylene ether), the poly(alkenyl aromatic) compound, and the acryloyl compound, the composition further comprises a polymeric additive selected from the group consisting of polystyrene, poly(styrene-maleic anhydride), poly(styrene-methyl methacrylate), polybutene, poly(ethylene-butylene), poly (vinyl ether), poly(vinyl acetate), and combinations comprising at least one of the foregoing polymeric additives.

Suitable polystyrenes for use as the polymeric additive include homopolymers and copolymers comprising at least about 80 weight percent, preferably at least about 90 weight percent, more preferably at least about 95 weight percent, still more preferable at least about 98 weight percent, of repeating structural units having the formula

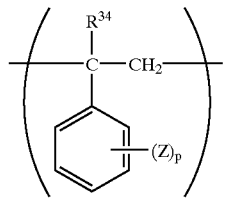

wherein $R^{34}$ is hydrogen, $C_1$–$C_8$ alkyl, halogen, or the like; Z is vinyl, halogen, $C_1$–$C_8$ alkyl, or the like; and p is 0 to 5. Preferred alkenyl aromatic monomers include styrene, chlorostyrenes such as p-chlorostyrene, and methylstyrenes such as p-methylstyrene. In addition to homopolymers and copolymers of the above alkenyl aromatic monomers, polystyrenes may further comprise copolymers further comprising up to 10% by weight of other copolymerizable monomers, such as, for example, acrylonitrile, butadiene, and maleic anhydride. A preferred polystyrene is a homopolymer of styrene having a number average molecular weight of about 10,000 to about 400,000 atomic mass units (AMU). The polystyrene may be atactic, syndiotactic, or isotactic, with atactic polystyrene being preferred. Suitable polystyrenes may be prepared by methods known in the art, including those described, for example, in U.S. Pat. No. 3,280,089 to Wright. Suitable polystyrenes may also be obtained commercially as, for example, DYLARK® 1200 and 1600 from Nova Chemical; polystyrene in styrene solution N715 from AOC Resins; the polystyrene having a weight average molecular weight of 280,000 and a glass transition temperature of 100° C. available under catalog number 18,242-7 from Aldrich Chemical; and various polystyrenes available from Polysciences Inc.

Poly(styrene-maleic anhydride) copolymers suitable for use as the polymeric additive include random copolymers of styrene and maleic anhydride having a styrene content of about 50 to about 95 weight percent and a maleic anhydride content of about 5 to about 50 weight percent. Such copolymers may be prepared by known methods, including those described, for example, in U.S. Pat. No. 3,404,135 to Tietz. They may also be obtained commercially as, for example, SMA® resins from Sartomer Company, such as SMA® 1000 having a weight average molecular weight of 5500 AMU, a glass transition temperature of 155° C., and acid number of 465–495; and the poly(styrene-maleic anhydride) having 14 weight percent maleic anhydride and a glass transition temperature of 132° C. available under catalog number 42,695-4 from Aldrich Chemical Co.

Poly(styrene-methyl methacrylate) copolymers suitable for use as the polymeric additive include random copolymers of styrene and methyl methacrylate having a styrene content of about 25 to about 90 weight percent and a methyl methacrylate content of about 10 to about 75 weight percent. Such copolymers may be prepared by known methods, such as those described in, for example, U.S. Pat. No. 4,680,352 to Janowicz et al. The poly(styrene-methyl methacrylate) copolymers may also be obtained commercially as, for example, NAS® resin 21 having a melt flow rate of 1.9 g/10 min measured at 200° C. and 5 kg according to ASTM D1238, and a Vicat softening temperature of 106° C. measured according to D1525, available from Nova Chemical Company; NAS® resin 30 having a melt flow rate of 2.2 g/10 min measured at 200° C. and 5 kg according to ASTM D1238, and a Vicat softening temperature of 104° C. measured according to D1525, available from Nova Chemical Company; and the poly(styrene-co-methylmethacrylate) having about 40 weight percent styrene, a weight average molecular weight of about 100,000–150,000 AMU, and a glass transition temperature of 101° C., available under catalog number 46,289-6 from Aldrich Chemical Co.

Polybutenes suitable for use as the polymeric additive include homopolymers and copolymers of 1-butene, 2-butene, and isobutene. The polybutene may preferably have a number average molecular weight of about 150 to about 3,000 atomic mass units (AMU). Polybutenes may be prepared according to known methods such as those described in, for example, U.S. Pat. No. 3,808,286 to Olund. They may also be obtained commercially as, for example, INDOPOL® Polybutenes L-4, L-6, L-10, L-14, H-15, H-25, H-35, H-40, H-50, H-100, H-300, H-1500, H-1900 from Amoco (these materials have number average molecular weights ranging from about 180 to about 2,500, polydispersity indices ranging from about 1 to about 2, and glass transition temperatures less than −65° C.); and PARAPOL® Polybutenes 450, 700, 950, 1300, 2350, and 2700 from ExxonMobil Chemical.

Poly(ethylene-butylene) copolymers suitable for use as the polymeric additive include random and block copolymers having an ethylene content of about 1 to about 99 weight percent and a butylene content of about 99 to about 1 weight percent. Butylene is herein defined as 1-butene. In addition to ethylene and butylene, the poly (ethylene-butylene) may include up to 10 weight percent of other monomers and functionalizing agents. For example, the poly(ethylene-butylene) may be a monohydroxy- or dihydroxy-terminated poly(ethylene-butylene) or a monocarboxy- or dicarboxy-terminated poly(ethylene-butylene). The poly(ethylene-butylene) copolymer may preferably have a number average molecular weight of about 1,000 to about 5,000 AMU. Suitable poly(ethylene-butylene) copolymers may be prepared according to known methods, such as polymerization of butadiene followed by hydrogenation. Suitable poly(ethylene-butylene) copolymers may also be obtained commercially as, for example, KRATON® L1203 from Kraton Polymers having a number average molecular weight of about 4,200; and KRATON® L2203 from Kraton Polymers having number average molecular weight of about 1,700.

Poly(vinyl ether) resins suitable for use as the polymeric additive include those comprising at least about 80 weight percent, preferably at least about 90 weight percent, more preferably at least about 95 weight percent, still more preferably at least about 98 weight percent, of repeating structural units having the formula

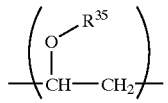

wherein $R^{35}$ is $C_1$–$C_{12}$ alkyl, $C_2$–$C_{12}$ alkenyl, $C_6$–$C_{18}$ aryl, $C_7$–$C_{18}$ alkylaryl, $C_7$–$C_{18}$ aralkyl, or the like. In a preferred embodiment, $R^{39}$ is $C_1$–$C_{12}$ alkyl. Preferred poly(vinyl ether) resins include, for example, poly(ethyl vinyl ether), poly (isobutyl vinyl ether), poly(cyclohexyl vinyl ether), and the like, copolymers of the corresponding vinyl ethers, and combinations comprising at least one of the foregoing poly(vinyl ethers). The poly(vinyl ether) may preferably have a number average molecular weight of about 3,000 to about 150,000 AMU. Within this range, a number molecular weight of at least about 10,000 AMU may be preferred. Also within this range, a number average molecular weight of up to about 100,000 AMU may be preferred. The poly(vinyl ether) may preferably have a glass transition temperature less than or equal to 20° C., more preferably less than or equal to 0° C. Poly(vinyl ether) resins may be prepared according to methods known in the art (e.g., U.S. Pat. No. 5,691,430 to Dougherty et al.) or obtained commercially as, for example, those sold under the tradename LUTENOL® from BASF, such as the poly(vinyl methyl ether) sold as LUTENOL® M, the poly(vinyl ethyl ether) sold as LUTENOL® A, the poly(vinyl isobutyl ether) sold as LUTENOL® I, and the poly(vinyl octadecyl ether) sold as LUWAX® V.

Poly(vinyl acetate) resins suitable for use as the polymeric additive include vinyl acetate homopolymers having a number average molecular weight of about 3,000 to about 150,000 AMU. Within this range, the number average molecular weight may preferably be at least about 10,000. Also within this range, the number average molecular weight may preferably be up to about 100,000 AMU. The poly(vinyl acetate) may preferably have a glass transition temperature less than or equal to about 70° C. Poly(vinyl acetate) resins may be prepared according to known methods (e.g., U.S. Pat. No. 3,285,895 to MacKenzie et al.) or obtained commercially as, for example, the carboxylated poly(vinyl acetate) provided as a 40 weight percent polymer solution in styrene, sold as LP40A by Dow (formerly sold by Union Carbide); a non-carboxylated poly(vinyl acetate) provided as a 40 weight percent polymer solution in styrene and sold as LP90 by Dow; a poly(vinyl acetate) copolymer provided as a 40 weight percent polymer solution in styrene and sold as NEULON® T by Dow.

In one preferred embodiment, the polymeric additive comprises a poly(vinyl ether). In another preferred embodiment, the polymeric additive comprises a poly (ethylene-butylene).

The polymeric additive may be used in an amount of about 0.1 to about 30 weight percent of the polymeric additive, based on the total weight of the functionalized poly(arylene ether), the alkenyl aromatic monomer, the acryloyl monomer, and the polymeric additive. Within this range it may be preferred to use a polymeric additive amount of at least about 0.5 weight percent, more preferably at least about 1 weight percent, yet more preferably at least about 2 weight percent, still more preferably at least about 5 weight percent, even more preferably at least about 8 weight percent. Also within this range, it may be preferred to use a polymeric additive amount of up to about 25 weight percent, more preferably up to about 20 weight percent, still more preferably up to about 15 weight percent. In general, it is preferred to use a polymeric additive amount that is less than the so-called critical point of the composition. The critical composition defines the additive level above which the phase separated additive changes from being a minor, dispersed phase, into being a continuous phase. The critical composition for a binary blend can be estimated using a thermodynamically derived equation and the component specific volumes (i.e., molecular weight/density). For a multi-component base resin, an average specific volume can be estimated. The critical volume fraction composition of component 1 is calculated as the reciprocal of the quantity 1 plus the square root of the ratio of component 1 specific volume over component 2 specific volume, as described in T. A. Callaghan, and D. R. Paul, *Macromolecules* (1993), volume 26, pages 2439–2450; and I. C. Sanchez, *Polymer* (1989), volume 30, pages 471–475.

In one embodiment, the polymeric additive may comprise a first polymeric additive comprising polystyrene, poly (styrene-maleic anhydride), poly(styrene-methyl methacrylate), polybutene, poly(ethylene-butylene), poly (vinyl ether), poly(vinyl acetate), and combinations comprising at least one of the foregoing polymeric additives; and a second polymeric additive selected from polybutadienes, polyacrylates, styrene-acrylonitrile copolymers, styrene-butadiene block and random copolymers, hydrogenated styrene-butadiene diblock copolymers, styrene-butadiene-styrene triblock copolymers, hydrogenated styrene-butadiene-styrene triblock copolymers, styrene-isoprene styrene triblock copolymers, hydrogenated styrene-isoprene-styrene triblock copolymers, ethylene-propylene-diene terpolymers, and the like, and combinations comprising at least one of the foregoing second polymeric additives.

These and other second polymeric additives are described in U.S. Published application Ser. No. 2001/0053820 A1 to Yeager et al. The second polymeric additive may be used in an amount of about 0.1 to about 30 weight percent, based on the total weight of the functionalized poly(arylene ether), the alkenyl aromatic monomer, the acryloyl monomer, the first polymeric additive, and the second polymeric additive.

In a highly preferred embodiment, the composition comprises a poly(ethylene-butylene) as the polymeric additive and a polybutadiene as the second polymeric additive. The polybutadiene may preferably have a number average molecular weight of about 1,000 to about 10,000 AMU. Within this range, the number average molecular weight may be at least about 2,000 AMU, or 3,000 AMU. Also within this range, the number average molecular weight may be up to about 9,000 AMU, or 8,000 AMU.

The composition may, optionally, further comprise a curing catalyst to increase the curing rate of the unsaturated components. Curing catalysts, also referred to as initiators, are well known to the art and used to initiate the polymerization, cure or crosslink any of numerous thermoplastics and thermosets including unsaturated polyester, vinyl ester and allylic thermosets. Non-limiting examples of curing catalysts are those described in "Plastic Additives Handbook, 4$^{th}$ Edition" R. Gachter and H. Muller (eds.), P. P. Klemchuck (assoc. ed.) Hansen Publishers, New York 1993, and in U.S. Pat. No. 5,407,972 to Smith et al., and U.S. Pat. No. 5,218,030 to Katayose et al. The curing catalyst for the unsaturated portion of the thermoset may include any compound capable of producing radicals at elevated temperatures. Such curing catalysts may include both peroxy and non-peroxy based radical initiators. Examples of useful peroxy initiators include, for example, benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5-dimethylhexane-2,5-dihydroperoxide, 2,5-dimethyl-2,5-di(t-butylperoxy)-hex-3-yne, di-t-butylperoxide, t-butylcumyl peroxide, alpha,alpha'-bis(t-butylperoxy-m-isopropyl)benzene, 2,5-dimethyl-2,5-di(t-butylperoxy)hexane, dicumylperoxide, di(t-butylperoxy isophthalate), t-butylperoxybenzoate, 2,2-bis(t-butylperoxy)butane, 2,2-bis(t-butylperoxy)octane, 2,5-dimethyl-2,5-di(benzoylperoxy)hexane, di (trimethylsilyl)peroxide, trimethylsilylphenyltriphenylsilyl peroxide, and the like, and mixtures comprising at least one of the foregoing curing catalysts. Typical non-peroxy initiators include, for example, 2,3-dimethyl-2,3-diphenylbutane, 2,3-trimethylsilyloxy-2,3-diphenylbutane, and the like, and mixtures comprising at least one of the foregoing curing catalysts. The curing catalyst for the unsaturated portion of the thermoset may further include any compound capable of initiating anionic polymerization of the unsaturated components. Such anionic polymerization catalysts include, for example, alkali metal amides, such as sodium amide ($NaNH_2$) and lithium diethyl amide ($LiN(C_2H_5)_2$); alkali metal and ammonium salts of $C_1$–$C_{10}$ alkoxides; alkali metal and ammonium hydroxides; alkali metal cyanides; organometallic compounds such as the alkyl lithium compound n-butyl lithium and the grignard reagent phenyl magnesium bromide; and the like; and combinations comprising at least one of the foregoing anionic polymerization catalysts.

In a preferred embodiment, the curing catalyst may comprise t-butylperoxybenzoate or methyl ethyl ketone peroxide. The curing catalyst may promote curing at a temperature of about 0° C. to about 200° C.

When present, the curing catalyst may be used in an amount of about 0.1 to about 10 parts by weight per 100 parts total of the functionalized poly(arylene ether), the alkenyl aromatic monomer, the acryloyl monomer, and the polymeric additive. Within this range, it may be preferred to use a curing catalyst amount of at least about 0.5 parts by weight, more preferably at least about 1 part by weight. Also within this range, it may be preferred to use a curing catalyst amount of up to about 5 parts by weight, more preferably up to about 3 parts by weight.

The composition may, optionally, further comprise a curing promoter to decrease the gel time. Suitable curing promoters include transition metal salts and complexes such as cobalt naphthanate; and organic bases such as N,N-dimethylaniline (DMA) and N,N-diethylaniline (DEA). Preferably, cobalt naphthanate and DMA are used in combination. When present, the promoter may be used in an amount of about 0.05 to about 3 parts, per 100 parts total of the functionalized poly(arylene ether), the alkenyl aromatic monomer, and the acryloyl monomer.

The composition may further comprise one or more fillers, including particulate fillers and fibrous fillers. Examples of such fillers well known to the art include those described in "Plastic Additives Handbook, 4$^{th}$ Edition" R. Gachter and H. Muller (eds.), P. P. Klemchuck (assoc. ed.) Hansen Publishers, New York 1993. A particulate filler is herein defined as a filler having an average aspect ratio less than about 5:1. Non-limiting examples of fillers include silica powder, such as fused silica and crystalline silica; boron-nitride powder and boron-silicate powders for obtaining cured products having low dielectric constant and low dielectric loss tangent; the above-mentioned powder as well as alumina, and magnesium oxide (or magnesia) for high temperature conductivity; and fillers, such as wollastonite including surface-treated wollastonite, calcium sulfate (as its anhydride, dihydrate or trihydrate), calcium carbonate including chalk, limestone, marble and synthetic, precipitated calcium carbonates, generally in the form of a ground particulate which often comprises 98+% $CaCO_3$ with the remainder being other inorganics such as magnesium carbonate, iron oxide, and alumino-silicates; surface-treated calcium carbonates; talc, including fibrous, modular, needle shaped, and lamellar talc; glass spheres, both hollow and solid, and surface-treated glass spheres typically having coupling agents such as silane coupling agents and/or containing a conductive coating; and kaolin, including hard, soft, calcined kaolin, and kaolin comprising various coatings known to the art to facilitate the dispersion in and compatibility with the thermoset resin; mica, including metallized mica and mica surface treated with aminosilanes or acryloylsilanes coatings to impart good physicals to compounded blends; feldspar and nepheline syenite; silicate spheres; flue dust; cenospheres; fillite; aluminosilicate (armospheres), including silanized and metallized aluminosilicate; natural silica sand; quartz; quartzite; perlite; Tripoli; diatomaceous earth; synthetic silica, including those with various silane coatings, and the like.

Preferred particulate fillers include calcium carbonates having an average particle size of about 1 to about 10 micrometers. Within this range, the average particle size may be at least about 2 micrometers, or at least about 3 micrometers. Also within this range, the average particle size may be up to about 8 micrometers, or up to about 7 micrometers.

Fibrous fillers include short inorganic fibers, including processed mineral fibers such as those derived from blends comprising at least one of aluminum silicates, aluminum oxides, magnesium oxides, and calcium sulfate hemihydrate. Also included among fibrous fillers are single crystal fibers or "whiskers" including silicon carbide, alumina, boron carbide, carbon, iron, nickel, copper. Also included among fibrous fillers are glass fibers, including textile glass fibers such as E, A, C, ECR, R, S, D, and NE glasses and quartz.

Preferred fibrous fillers include glass fibers having a diameter of about 5 to about 25 micrometers and a length before compounding of about 0.5 to about 4 centimeters.

Many other suitable fillers are described in U.S. Published application Ser. No. 2001/0053820 A1 to Yeager et al.

When present, the particulate filler may be used in an amount of about 5 to about 80 weight percent, based on the total weight of the composition. Within this range, it may be preferred to us a particulate filler amount of at least about 10 weight percent, more preferably at least about 20 weight percent, yet more preferably at least about 30 weight percent, still more preferably at least about 40 weight percent. Also within this range, it may be preferred to use a particulate filler amount of up to about 70 weight percent, more preferably up to about 60 weight percent.

When present, the fibrous filler may be used in an amount of about 2 to about 80 weight percent, based on the total weight of the composition. Within this range, it may be preferred to us a fibrous filler amount of at least about 5 weight percent, more preferably at least about 10 weight percent, yet more preferably at least about 15 weight percent. Also within this range, it may be preferred to use a fibrous filler amount of up to about 60 weight percent, more preferably up to about 40 weight percent, still more preferably up to about 30 weight percent.

These aforementioned fillers may be added to the thermosetting resin without any treatment, or after surface treatment, generally with an adhesion promoter.

The formulation may also contain adhesion promoters to improve adhesion of the thermosetting resin to the filler or to an external coating or substrate. Also possible is treatment of the aforementioned inorganic fillers with adhesion promoter to improve adhesion. Adhesion promoters include chromium complexes, silanes, titanates, zirco-aluminates, propylene maleic anhydride copolymers, reactive cellulose esters and the like. Chromium complexes include those sold by DuPont under the tradename VOLAN®. Silanes include molecules having the general structure $(RO)_{(4-n)}SiY_n$ wherein n=1–3, R is an alkyl or aryl group and Y is a reactive functional group which can enable formation of a bond with a polymer molecule. Particularly useful examples of coupling agents are those having the structure $(RO)_3 SiY$. Typical examples include vinyl-triethoxysilane, vinyl tris(2-methoxy)silane, γ-methacryloxypropyltrimethoxy silane, γ-aminopropyltriethoxysilane, γ-glycidoxypropyltrimethoxysilane, γ-mercaptopropyltrimethoxysilane. Titanates include those developed by S. J. Monte et al. in Ann. Chem. Tech Conf. SPI (1980), Ann. Tech Conf. Reinforced Plastics and Composite inst. SPI 1979, Section 16E, New Orleans; and S. J. Monte, Mod. Plastics Int. 14(1984) 6 pg. 2. Zirco-aluminates include those described by L. B. Cohen in Plastics Engineering 39 (1983) 11, pg. 29. The adhesion promoter may be included in the thermosetting resin itself, or coated onto any of the fillers described above to improve adhesion between the filler and the thermosetting resin. For example such promoters may be used to coat a silicate fiber or filler to improve adhesion of the resin matrix.

In a preferred embodiment, the filler comprises calcium carbonate. In another preferred embodiment, the filler comprises glass fibers. In a highly preferred embodiment, the filler comprises both calcium carbonate and glass fibers.

The composition may, optionally, further comprising an additive selected from flame retardants, mold release agents and other lubricants, antioxidants, thermal stabilizers, ultra-violet stabilizers, pigments, dyes, colorants, anti-static agents, conductive agents, curing promoters, and the like, and combinations comprising at least one of the foregoing additives. Selection of particular additives and their amounts may be performed by those skilled in the art.

There is no particular limitation on the method by which the composition is prepared. The composition may be prepared by forming an intimate blend of the functionalized poly(arylene ether), the alkenyl aromatic monomer, the acryloyl monomer, and the polymeric additive. When the functionalized poly(arylene ether) is a capped poly(arylene ether), the composition may be prepared directly from an uncapped poly(arylene ether) by dissolving the uncapped poly(arylene ether) in a portion of the alkenyl aromatic monomer, adding a capping agent to form the capped poly(arylene ether) in the presence of the alkenyl aromatic monomer, and adding the acryloyl monomer, the polymeric additive, and any other components to form the thermoset composition.

There is no particular limitation on the method by which the composition may be cured. The composition may, for example, be cured thermally or by using irradiation techniques, including UV irradiation and electron beam irradiation. When heat curing is used, the temperature selected may be about 80° to about 300° C. Within this range, a temperature of at least about 120° C. may be preferred. Also within this range, a temperature up to about 240° C. may be preferred. The heating period may be about 30 seconds to about 24 hours. Within this range, it may be preferred to use a heating time of at least about 1 minute, more preferably at least about 2 minutes. Also within this range, it may be preferred to use a heating time up to about 10 hours, more preferably about 5 hours, yet more preferably up to about 3 hours. Such curing may be staged to produce a partially cured and often tack-free resin, which then is fully cured by heating for longer periods or temperatures within the aforementioned ranges.

The composition exhibits highly desirable properties. For example the composition after molding may exhibit a shrinkage at least 10% less than the shrinkage exhibited by a corresponding composition without the polymeric additive. Shrinkage is determined by comparing a dimension of a molded part with the corresponding dimension of the mold. This comparison is performed at room temperature about 24 hours after the sample is molded. The shrinkage is preferably at least 20% less, more preferably at least 30% less, still more preferably at least 40% less, even more preferably at least 50% less than that of the no-additive comparison.

The composition after molding in a Class A surface mold preferably exhibits an orange peel value less than 40, more preferably less than 35, still more preferably less than 30, yet more preferably less than 25, even more preferably less than 20. These measurements are made using a commercial technique called D-Sight in which incandescent light is reflected off the surface of a part. Surface roughness or waviness is seen as light and dark variations in reflected light intensity and are correlated with a numerical assessment of performance using software algorithms. For these measurements, the D-Sight camera and light source are set at angle of 23 degrees below horizontal and the part placed at a distance of 50 inches from the base of the camera/light source. The part itself is set at an angle of 10 degrees above horizontal facing the inspection system. Measurements are made on parts with gloss surfaces obtained by either painting the part with gloss black paint or wiping the surface with highlighting oil. For measurements, the light level reading is kept between 90 and 110.

The composition after molding in a Class A surface mold preferably exhibits a waviness less than 300, more preferably less than 200, still more preferably less than 150, yet more preferably less than 120.

In one embodiment, the curable compositions comprises: about 10 to about 90 parts by weight of a functionalized poly(arylene ether); about 10 to about 90 parts by weight of an alkenyl aromatic monomer; about 1 to about 50 parts by weight of an acryloyl monomer; and about 0.1 to about 30 parts by weight of a poly(vinyl ether).

In another embodiment, the curable composition comprises: about 20 to about 60 parts by weight of a methacrylate-capped poly(arylene ether); about 20 to about 60 parts by weight of styrene; about 5 to about 20 parts by weight of an acryloyl monomer; and about 5 to about 20 parts by weight of a poly(vinyl ether); about 100 to about 500 parts by weight of calcium carbonate; and about 50 to about 200 parts by weight of glass fibers.

In another embodiment, the curable composition comprises: about 10 to about 90 parts by weight of a functionalized poly(arylene ether); about 10 to about 90 parts by weight of an alkenyl aromatic monomer; about 1 to about 50 parts by weight of an acryloyl monomer; and about 0.1 to about 30 parts by weight of a polymeric additive comprising a polybutadiene and a poly(ethylene-butylene). The weight ratio of the polybutadiene and the poly(ethylene-butylene) may preferably be about 0.1 to about 10. After curing, such compositions may preferably exhibit (as evidenced by electron microscopy) a first dispersed phase having an average particle size of about 0.5 to about 2 micrometers and a second dispersed phase having a particle size of about 5 to about 25 micrometers.

Another embodiment is a curable composition comprising: about 20 to about 60 parts by weight of a methacrylate-capped poly(arylene ether); about 20 to about 60 parts by weight of styrene; about 5 to about 30 parts by weight of an acryloyl monomer; about 5 to about 20 parts by weight of a polymeric additive comprising a polybutadiene and a poly(ethylene-butylene); about 100 to about 500 parts by weight of calcium carbonate; and about 50 to about 200 parts by weight of glass fibers.

Another embodiment is a curable composition, comprising: about 10 to about 90 parts by weight of a functionalized poly(arylene ether); about 10 to about 90 parts by weight of an alkenyl aromatic monomer; about 1 to about 50 parts by weight of an acryloyl monomer; and about 0.1 to about 30 parts by weight of a polymeric additive having a glass transition temperature less than or equal to 100° C. and a Young's modulus less than or equal to 1000 megapascals at 25° C.; wherein the polymeric additive is soluble in the combined functionalized poly(arylene ether), alkenyl aromatic monomer, and acryloyl monomer at a temperature less than or equal to 50° C.; and wherein all parts by weight are based on 100 parts by weight total of the functionalized poly(arylene ether), the alkenyl aromatic monomer, the acryloyl monomer, and the polymeric additive.

Another embodiment is a curable composition, comprising: about 20 to about 60 parts by weight of a methacrylate-capped poly(arylene ether); about 20 to about 60 parts by weight of styrene; about 5 to about 20 parts by weight of an acryloyl monomer; and about 5 to about 20 parts by weight of a polymeric additive having a glass transition temperature less than or equal to 0° C. and a Young's modulus less than or equal to 100 megapascals at 25° C.; wherein the polymeric additive is soluble in the combined functionalized poly(arylene ether), alkenyl aromatic monomer, and acryloyl monomer at a temperature less than or equal to 30° C.; and wherein all parts by weight are based on 100 parts by weight total of the functionalized poly(arylene ether), the alkenyl aromatic monomer, the acryloyl monomer, and the polymeric additive.

Another embodiment is a curable composition, comprising: an alkenyl aromatic monomer; an acryloyl monomer; and a polymeric additive having a glass transition temperature less than or equal to 100° C. and a Young's modulus less than or equal to 1000 MPa at 25° C.; wherein the polymeric additive is soluble in the combined functionalized poly(arylene ether), alkenyl aromatic monomer, and acryloyl monomer at a temperature less than or equal to 50° C.

Other embodiments include the reaction product obtained by curing any of the above curable compositions.

Still other embodiments include articles comprising any of the cured compositions. Articles that may be fabricated from the composition include, for example, acid bath containers, neutralization tanks, electrorefining tanks, water softener tanks, fuel tanks, filament-wound tanks, filament-wound tank linings, electrolytic cells, exhaust stacks, scrubbers, automotive exterior panels, automotive floor pans, automotive air scoops, truck bed liners, drive shafts, drive shaft couplings, tractor parts, transverse leaf springs, crankcase heaters, heat shields, railroad tank cars, hopper car covers, boat hulls, submarine hulls, boat decks, marine terminal fenders, aircraft components, propeller blades, missile components, rocket motor cases, wing sections, sucker rods, fuselage sections, wing skins, wing flairings, engine narcelles, cargo doors, aircraft stretch block and hammer forms, bridge beams, bridge deckings, stair cases, railings, walkways, pipes, ducts, fan housings, tiles, building panels, scrubbing towers, flooring, expansion joints for bridges, injectable mortars for patch and repair of cracks in structural concrete, grouting for tile, machinery rails, metal dowels, bolts, posts, electrical encapsulants, electrical panels, printed circuit boards, electrical components, wire windings, seals for electromechanical devices, battery cases, resistors, fuses, thermal cut-off devices, coatings for printed wiring boards, capacitors, transformers, electrically conductive components for antistatic applications, tennis racquets, golf club shafts, fishing rods, skis, ski poles, bicycle parts, swimming pools, swimming pool slides, hot tubs, saunas, mixers, business machine housings, trays, dishwasher parts, refrigerator parts, furniture, garage doors, gratings, protective body gear, luggage, optical waveguides, radomes, satellite dishes, signs, solar energy panels, telephone switchgear housings, transformer covers, insulation for rotating machines, commutators, core insulation, dry toner resins, bonding jigs, inspection fixtures, industrial metal forming dies, vacuum molding tools, and the like.

The composition is particularly useful for fabricating automotive components such as, for example, automotive body panels.

The invention is further illustrated by the following non-limiting examples.

EXAMPLES 1–7

Comparative Example 1

Seven examples and one comparative example were prepared to demonstrate the effect of polyvinylether additives on shrinkage. The poly(arylene ether) was a methacrylate-capped poly(2,6-dimethyl-1,4-phenylene ether) ("PPO- MAA") having an intrinsic viscosity of 0.12 deciliters per gram at 25° C. in chloroform. It was prepared as described in Example 1 of International Patent Application WO 01/40354 A1. The crosslinker in all examples was trimethylolpropane trimethacrylate ("TMPTMA"), obtained from Sartomer. Styrene and t-butylperoxybenzoate were obtained from Aldrich Chemical Company. Calcium carbonate was obtained from Omya Corporation as OMYACARB® 5. Glass fibers were obtained as chopped one-half inch fibers from Owens Corning Fiberglass Corporation.

An ethanol solution of a poly(ethyl vinyl ether) having a number average molecular weight ($M_n$) of approximately 22,000 atomic mass units (AMU) was obtained from Scientific Polymer Products. An ethanol solution of a poly(ethyl vinyl ether) having a number average molecular weight ($M_n$) of approximately 1,000 AMU was obtained from Scientific Polymer Products. An ethanol solution of a poly(isobutyl vinyl ether) having a number average molecular weight ($M_n$) of approximately 15,000 AMU was obtained from Scientific Polymer Products. Each poly(vinyl ether) solution was reduced to a neat poly(vinyl ether) resin by rotary evaporation. The poly(vinyl ether) sample was weighed and dissolved in an equal weight of styrene. The resulting 50% poly(vinyl ether)/styrene solution was combined with a 42.5 weight percent solution of PPO-MAA in styrene and trimethylolpropane trimethacrylate in the amounts (expressed in parts by weight, "pbw") shown in Table 1, below. The solution became fluid and apparently homogeneous after heating to approximately 50 to 70° C. Zinc stearate and calcium carbonate ($CaCO_3$) were then added and the mixture was stirred vigorously to form a pasty mixture. The t-butylperoxybenzoate was added and the bulk molding compound was formed by blending the pasty mixture with one-half inch glass fibers in a mixing bowl. The compositions were molded at 150° C. and 1,200 psi and the shrinkage was measured by comparison of the width of the sample to that of the mold.

As shown, the shrinkage of blends containing poly(ethyl vinyl ether) and/or poly (isobutyl vinyl ether) (Exs. 1–7) was significantly lower than the control (C. Ex. 1), demonstrating the utility of poly(vinyl ether)s in reducing shrinkage of thermoset compositions comprising poly(arylene ether) resins. Example 4, with poly(isobutyl vinyl ether) exhibited slight expansion (negative shrinkage) of the molded part.

Two poly(arylene ether) types were used. The poly (arylene ether) designated "50/50—0.12 IV PPO-MAA/Styrene" in Table 2 was a 50 weight percent solution in styrene of a methacrylate-capped poly(2,6-dimethyl-1,4-phenylene ether) having an intrinsic viscosity of 0.12 dL/g. The poly(arylene ether) designated "50/50—0.12 IV PPO-Psal/Styrene" was a 50 weight percent solution in styrene of a polysalicylate-capped poly(2,6-dimethyl-1,4-phenylene ether) having an intrinsic viscosity of 0.12 dL/g; this material was prepared using the procedure from Example 3 of U.S. Pat. No. 4,760,118 to White et al.

Several polymeric additives were employed. The additive designated "CTB X162 Hycar" in Table 2 was a carboxy-terminated butadiene homopolymer having a carboxyl content acid number of 25, a solubility parameter (based on molar attraction constants) of 8.14, a number average molecular weight of 4,200 AMU, and a glass transition temperature of −77° C., obtained as HYCAR® 2000X162 CTB from Noveon Solutions. "CTBN 1300X31 Hycar" was a carboxy-terminated butadiene (90%)/acrylonitrile (10%) copolymer having a carboxyl content acid number of 28, a solubility parameter of 8.14, a number average molecular weight of 3,800 AMU, and a glass transition temperature of −66° C., obtained as HYCAR® 1300X31 CTBN from Noveon Solutions. "VTBNX 1300X33 Hycar" was a methacrylate vinyl butadiene (82%)/acrylonitrile (18%) copolymer having an acid number less than 5, a solubility parameter of 8.9, a number average molecular weight of 3,600 AMU, and a glass transition temperature of −49° C., obtained as HYCAR® 1300X33 VTBNX from Noveon Solutions. "PMMA N700 AOC" was a poly(methyl methacrylate) homopolymer provided as a 32 weight percent solution in styrene, obtained as N700 from AOC Resins. "PS N715 AOC" was a polystyrene homopolymer provided as a 32 weight percent solution in styrene, obtained as N715 from AOC Resins. "PVac LP40A UC" was a poly(vinyl acetate) copolymer provided as a 40 weight percent solution in styrene, obtained as LP40A from Union Carbide (this product is currently sold by Dow Chemical). "PVac LP90 UC" was a poly(vinyl acetate) copolymer provided as a 40 weight percent solution in styrene, obtained as LP90 from Union Carbide (now Dow). "PVac NeulonT UC" was a poly(vinyl acetate) copolymer provided as a 40 weight percent solution in styrene, obtained as NEULON® T from Union Carbide (now Dow). "SB Copoly XV-2314 AOC"

TABLE 1

| | Ex.1 | Ex.2 | Ex.3 | C. Ex.1 | Ex.4 | Ex.5 | Ex.6 | Ex.7 |
|---|---|---|---|---|---|---|---|---|
| PPO-MAA/Styrene (42.5% wt./wt.) Solution (pbw) | 85 | 85 | 85 | 85 | 85 | 85 | 85 | 85 |
| Trimethylolpropane Trimethacrylate (pbw) | 20 | 20 | 20 | 20 | 20 | 20 | 20 | 20 |
| Poly(ethyl vinyl ether), $M_n$ = 22,000 (pbw) | 0 | 20 | 30 | 0 | 0 | 20 | 30 | 10 |
| Poly(ethyl vinyl ether), $M_n$ = 1,000 (pbw) | 0 | 0 | 0 | 0 | 0 | 0 | 0 | 10 |
| Poly(isobutyl vinyl ether), $M_n$ = 15,200 (pbw) | 0 | 0 | 0 | 0 | 20 | 0 | 0 | 0 |
| Styrene (pbw) | 0 | 0 | 0 | 0 | 10 | 10 | 10 | 10 |
| t-Butylperoxybenzoate (pbw) | 2 | 2 | 0 | 2 | 2 | 2 | 0 | 2 |
| Zinc Stearate (pbw) | 3 | 3 | 0 | 3 | 3 | 3 | 0 | 3 |
| Calcium Carbonate (6 micron) (pbw) | 240 | 240 | 260 | 240 | 240 | 240 | 0 | 260 |
| ½" Glass Fiber (pbw) | 90 | 90 | 97.5 | 90 | 90 | 90 | 0 | 97.5 |
| Shrinkage (%) | 0.183 | 0.047 | 0.014 | 0.183 | −0.009 | 0.057 | 0.005 | 0.06 |

EXAMPLES 8–24

Comparative Examples 2 and 3

Twenty-five examples and two comparative examples were prepared, varying primarily in the type and amount of polymeric additive. Compositions and properties are summarized in Table 2.

was a styrene-butadiene copolymer provided as a 35 weight percent solution in styrene, obtained as XV-2314 from AOC Resins.

The crosslinker in all examples was trimethylolpropane triacrylate (TMPTA).

An organic peroxide initiator was obtained as LUPEROX® P from Atofina and used at 2 parts per hundred resin in all samples.

A calcium carbonate having an average particle size of 5 micrometers was obtained from Omya Corporation and used at 56 weight percent in all samples. Glass fibers having a length of 13 millimeters and a diameter of 17 micrometers were obtained as OCF-163D-17C from Owens Corning Fiber and used at 20 weight percent in all samples.

For each sample, the resin components were mixed thoroughly at about 60 to 70° C. using a Cowles impellor to form a paste. After adding initiator and inorganic fillers, glass fibers were compounded into the paste using a low shear Hobart dough mixer. Molding utilized a glass-A mold manufactured by Heyden Mold & Bench of Tailmadge, Ohio. For each composition, four plaques (approximately 650 g, ⅛ inch thick by 12 inch square) were made by compression molding at 1200 pounds per square inch (psi) for 2 minutes.

Part warp was measured as the maximum vertical deflection of a given corner with the plaque resting on a flat reference surface.

For shrinkage evaluation, the part was clamped to a flat surface and plaque diagonals were measured. Shrinkage was calculated relative to the size of the compression mold cavity.

Orange peel and waviness were measured with an LMI Technologies D-Sight analyzer. These are non-contact measurements in which reflected light is captured by a video system and analyzed. The technique can be used to analyze short-wave deviations (microns to about 1 centimeter; "orange peel") and long-wave deviations (about 1 centimeter to as large as the dimension of the sampled area; "waviness") from a perfectly flat surface. For a given data set, all measurements were made during the same measurement session. Lower values of orange peel and roughness are more desirable. Although there is not currently a standard definition of Class A Surface, it is generally considered to include an orange peel value of less than or equal to about 20 and a waviness value less than or equal to 120.

Cured phase behavior was determined as follows. All resin chemistries were separately formulated in the lab without inorganic filler or glass reinforcement. Drops of the resins without initiator were placed in the polished well of a glass slide, covered, and inspected under a microscope equipped with a METTLER® hot stage. Visual inspection was used to assess miscibility, first at 150° C. and then again after cooling to 25° C. In separate samples, initiator was added to the neat resins and they were molded into 3 mm thick plaques between two sheets of polished metal plate using a Micromet Instruments Minipress (MP-2000). Assessments of uncured resin miscibility are denoted as "+" for miscible, "−" for immiscible. Cured resin phase behavior are denoted as "S" for single phase, "M" for multiphase. These assessments are based on the presence or absence of discernable heterogeneities that, in uncured resins, are large enough to be observed under an optical microscope, or, in cured samples, are large enough to scatter significant visible light and render samples translucent or opaque.

The results in Table 2 show that Examples 8–24 with styrene-butadiene copolymer, polystyrene, poly(methyl methacrylate), poly(vinyl acetate), carboxy-terminated polybutadiene, or carboxy-terminated poly(butadiene-co-acrylonitrile), exhibited reduced shrinkage compared to their respective controls (Comparative Example 2 and 3). Waviness was also reduced in most cases.

TABLE 2

|  | C. Ex.2 | C. Ex.3 | Ex.8 | Ex.9 | Ex.10 |
| --- | --- | --- | --- | --- | --- |
| Base Resin Type | 50/50-0.12 IV PPO-MAA/Styrene | 50/50-0.12 IV PPO-Psal/Styrene | 50/50-0.12 IV PPO-MAA/Styrene | 50/50-0.12 IV PPO-MAA/Styrene | 50/50-0.12 IV PPO-MAA/Styrene |
| Base Resin Amount (pbw) | 74 | 74 | 60.7 | 63.8 | 58.4 |
| Additive Type | — | — | SB Copoly XV-2314 AOC | PS N715 AOC | PMMA N700 AOC |
| Additive Amount (pbw) | 0 | 0 | 28.6 | 25.0 | 31.3 |
| Additional Styrene Amount (pbw) | 13.0 | 13.0 | 0 | 0 | 0 |
| Crosslinker Amount (pbw) | 13.1 | 13.1 | 10.7 | 11.3 | 10.3 |
| Resin Miscibility 25° C./150° C. | −/+ | +/+ | −/+ | −/+ | −/− |
| Cured Phase Behavior | S | M | S | M | M |
| Warp (mm) | 1.2 | 8.7 | 5.4 | 2.7 | 3.2 |
| Shrinkage (%) | 0.22 | 0.28 | 0.20 | 0.20 | 0.18 |
| Orange Peel | 33 | 41 | 37 | 38 | 40 |
| Waviness | 1798 | 1788 | 2000 | 1870 | 1561 |
| Critical Strain (%) | 0.52 | 0.39 | — | 0.53 | 0.52 |

|  | Ex.11 | Ex.12 | Ex.13 | Ex.14 | Ex.15 |
| --- | --- | --- | --- | --- | --- |
| Base Resin Type | 50/50-0.12 IV PPO-MAA/Styrene | 50/50-0.12 IV PPO-MAA/Styrene | 50/50-0.12 IV PPO-MAA/Styrene | 50/50-0.12 IV PPO-MAA/Styrene | 50/50-0.12 IV PPO-MAA/Styrene |
| Base Resin Amount (pbw) | 63.8 | 63.8 | 63.8 | 66.5 | 66.5 |
| Additive Type | PVac LP40A UC | PVac LP90 UC | PVac NeulonT UC | CTB 2000X162 Hycar | CTBN 1300X31 Hycar |
| Additive Amount (pbw) | 25.0 | 25.0 | 25.0 | 10.0 | 10.0 |
| Additional Styrene Amount (pbw) | 0 | 0 | 0 | 11.8 | 11.8 |
| Crosslinker Amount (pbw) | 11.3 | 11.3 | 11.3 | 11.7 | 11.7 |
| Resin Miscibility 25° C./150° C. | −/− | −/− | −/− | −/+ | −/+ |
| Cured Phase Behavior | M | M | M | S? | S? |
| Warp (mm) | 2.9 | 1.8 | 1.4 | 1.3 | 0.9 |
| Shrinkage (%) | 0.17 | 0.18 | 0.18 | 0.13 | 0.13 |
| Orange Peel | 37 | 36 | 39 | 37 | 40 |

TABLE 2-continued

|  | | | | | |
|---|---|---|---|---|---|
| Waviness | 1082 | 1406 | 1549 | 1569 | 1184 |
| Critical Strain (%) | 0.59 | 0.51 | 0.59 | 0.55 | 0.57 |

|  | Ex.16 | Ex.17 | Ex.18 | Ex.19 | Ex.20 |
|---|---|---|---|---|---|
| Base Resin Type | 50/50-0.12 IV PPO-Psal/Styrene | 50/50-0.12 IV PPO-Psal/Styrene | 50/50-0.12 IV PPO-Psal/Styrene | 50/50-0.12 IV PPO-Psal/Styrene | 50/50-0.12 IV PPO-Psal/Styrene |
| Base Resin Amount (pbw) | 60.7 | 63.8 | 58.4 | 63.8 | 63.8 |
| Additive Type | SB Copoly XV-2314 AOC | PS N715 AOC | PMMA N700 AOC | PVac LP40A UC | PVac LP90A UC |
| Additive Amount (pbw) | 28.6 | 25.0 | 31.3 | 25.0 | 25.0 |
| Additional Styrene Amount (pbw) | 0 | 0 | 0 | 0 | 0 |
| Crosslinker Amount (pbw) | 10.7 | 11.3 | 10.3 | 11.3 | 11.3 |
| Resin Miscibility 25° C./150° C. | +/+ | +/+ | −/− | −/− | −/− |
| Cured Phase Behavior | S | M | M | M | M |
| Warp (mm) | 4.1 | 2.9 | 1.4 | 1.5 | 1.9 |
| Shrinkage (%) | 0.27 | 0.25 | 0.25 | 0.15 | 0.20 |
| Orange Peel | 52 | 40 | 38 | 33 | 46 |
| Waviness | 1309 | 1295 | 753 | 691 | 1926 |
| Critical Strain (%) | 0.45 | 0.46 | 0.45 | 0.46 | 0.45 |

|  | Ex.21 | Ex.22 | Ex.23 | Ex.24 |
|---|---|---|---|---|
| Base Resin Type | 50/50-0.12 IV PPO-Psal/Styrene | 50/50-0.12 IV PPO-Psal/Styrene | 50/50-0.12 IV PPO-Psal/Styrene | 50/50-0.12 IV PPO-Psal/Styrene |
| Base Resin Amount (pbw) | 63.8 | 66.5 | 66.5 | 66.5 |
| Additive Type | PVac NeulonT UC | CTB 2000X162 Hycar | CTBN 1300X31 Hycar | VTBN 1300X33 Hycar |
| Additive Amount (pbw) | 25.0 | 10.0 | 10.0 | 10.0 |
| Additional Styrene Amount (pbw) | 0 | 11.8 | 11.8 | 11.8 |
| Crosslinker Amount (pbw) | 11.3 | 11.7 | 11.7 | 11.7 |
| Resin Miscibility 25° C./150° C. | −/− | −/+ | −/+ | −/+ |
| Cured Phase Behavior | M | M | M | M |
| Warp (mm) | 2.3 | 1.7 | 2.0 | 7.0 |
| Shrinkage (%) | 0.16 | 0.15 | 0.16 | 0.29 |
| Orange Peel | 38 | 39 | 45 | 57 |
| Waviness | 1025 | 1182 | 1607 | 2625 |
| Critical Strain (%) | 0.52 | 0.45 | 0.47 | 0.41 |

EXAMPLES 25–30

Six samples were prepared varying in crosslinker amount, and polymeric additive and amount. The base resin for all samples was a 50 weight percent solution in styrene of a methacrylate-capped poly(2,6-dimethyl-1,4-phenylene ether) having an intrinsic viscosity of 0.12 dL/g.

The crosslinker was trimethylolpropane triacrylate (TMPTA) or trimethylolpropane trimethacrylate (TMPTMA). The initiator was t-butyl peroxy-2-ethylhexanoate, obtained as LUPEROX® 26 from Atofina Chemicals.

Three different polymeric additives were used. The additive designated "PEB Kraton L1203" in Table 3 was a monohydroxy-terminated poly(ethylene-butylene) having a hydroxyl equivalent molecular weight of 4,200 AMU, an approximate hydroxyl functionality of 0.9, and a specific gravity of 0.88 g/cc, obtained as KRATON® L1203 from Kraton Polymers. "PB Lithene N4-9000" was a liquid polybutadiene having a number average molecular weight of 9,000, 10–20% 1,2 vinyl microstructure, 50–60% trans-1,4 and 25–35% cis-1,4 structure, obtained as N4-9000 from Revertex Chemicals Limited (Hartlepool, UK). "CTB Hycar 2000X162" was a carboxy-terminated butadiene homopolymer having a carboxyl content acid number of 25, a solubility parameter (based on molar attraction constants) of 8.14, a number average molecular weight of 4,200 AMU, and a glass transition temperature of −77° C., obtained as HYCAR® 2000X162 CTB from Noveon Solutions.

Each sample was prepared as a 3 kilogram batch containing 25 weight percent resin, 54 weight percent calcium carbonate, 20 weight percent glass fibers, and 1 weight percent of the mold release agent zinc stearate. Components amount in Table 3 are expressed in grams and reflect contributions to a 3 kg batch.

Samples molded at 120° C. and 1,200 psi for 2 minutes. Orange peel was measured as described above. Compositions and properties are summarized in Table 3. The results show reduced orange peel values relative to control samples represented by Control Examples 4 and 5, below.

TABLE 3

|  | Ex.25 | Ex.26 | Ex.27 | Ex.28 | Ex.29 | Ex.30 |
|---|---|---|---|---|---|---|
| Base Resin Amount (pbw) | 612 | 576 | 574 | 540 | 574 | 540 |
| Crosslinker Type | TMPTA | TMPTMA | TMPTA | TMPTMA | TMPTA | TMPTMA |

TABLE 3-continued

|  | Ex.25 | Ex.26 | Ex.27 | Ex.28 | Ex.29 | Ex.30 |
|---|---|---|---|---|---|---|
| Crosslinker Amount (pbw) | 108 | 144 | 101 | 135 | 101 | 135 |
| Additive Type | PEB Kraton L1203 | PEB Kraton L1203 | PB Lithene N4-9000 | PB Lithene N4-9000 | CTB Hycar X162 | CTB Hycar X162 |
| Additive Amount (pbw) | 30 | 30 | 75 | 75 | 75 | 75 |
| Initiator Amount (pbw) | 15 | 15 | 15 | 15 | 15 | 15 |
| Mold Release Amount (pbw) | 30 | 30 | 30 | 30 | 30 | 30 |
| Carbonate Amount (pbw) | 1620 | 1620 | 1620 | 1620 | 1620 | 1620 |
| Glass Fiber Amount (pbw) | 600 | 600 | 600 | 600 | 600 | 600 |
| Orange Peel | 24.2 | 24.0 | 31.9 | 28.4 | 31.8 | 34.4 |

EXAMPLES 31–36

Comparative Example 4

Nine compositions were prepared, varying in the amount of polybutadiene and poly(ethylene-butylene) additives. The base resin for all samples was a 50 weight percent solution in styrene of a methacrylate-capped poly(2,6-dimethyl-1,4-phenylene ether) having an intrinsic viscosity of 0.12 dL/g. The crosslinker for all samples was trimethylolpropane trimethacrylate. A polybutadiene having a number average molecular weight of 8,000, and a vinyl content of 28% was obtained as RICON® 134 from Sartomer. A monohydroxy-terminated poly(ethylene-butylene) copolymer having a hydroxyl equivalent weight of 4,200 and 0.9 hydroxyl functionality was obtained as KRATON® L1203 from Kraton Polymers. All samples were based on 25% total resin, 54% calcium carbonate, 1% zinc stearate, and 20% 13 millimeter glass fibers.

Molding was performed at 150° C. and 1,200 psi. Shrinkage, orange peel, and waviness were measured for each sample.

The results, presented in Table 4, show that either polybutadiene or poly (ethylene-butene) alone reduces shrinkage and, in most cases, orange peel and waviness. The results further show that the combination of polybutadiene and poly (ethylene-butylene), each at 5 weight percent, is particularly effective to reduce shrinkage, orange peel, and waviness.

TABLE 4

|  | C. Ex.4 | Ex.31 | Ex.32 | Ex.33 | Ex.34 | Ex.35 | Ex.36 |
|---|---|---|---|---|---|---|---|
| Base resin (pbw) | 80 | 80 | 80 | 80 | 80 | 80 | 80 |
| Trimethylolpropane trimethacrylate (pbw) | 20 | 20 | 20 | 20 | 20 | 20 | 20 |
| polybutadiene (pbw) | — | 5 | 10 | — | — | 2.5 | 5.0 |
| poly(ethylene-butylene) (pbw) | — | — | — | 2.5 | 5.0 | 2.5 | 5.0 |
| Shrinkage (%) | 0.24 | 0.23 | 0.17 | 0.17 | 0.14 | 0.17 | 0.13 |
| Orange Peel | 45 | 47 | 40 | 40 | 40 | 43 | 32 |
| Waviness | 1700 | 1800 | 1300 | 1500 | 910 | 1450 | 760 |

EXAMPLE 37

Comparative Example 5

Two samples were prepared with and without 10 weight percent of a 50:50 weight/weight mixture of polybutadiene and poly(ethylene-butylene). Components were the same as those described above for Examples 38–43.

Molding was performed at 150° C. and 1,200 psi. Shrinkage, orange peel, and waviness values represent averages for two samples.

Compositions and properties are presented in Table 5. The results show that the combination of polybutadiene and poly(ethylene-butylene) is particularly effective at reducing shrinkage (to the point of causing slight expansion in Ex. 44), orange peel, and waviness.

TABLE 5

|  | C. Ex. 5 | Ex. 37 |
|---|---|---|
| 50/50 0.12 IV PPO-MAA/styrene (pbw) | 80 | 80 |
| Trimethylolpropane trimethacrylate (pbw) | 20 | 20 |
| Polybutadiene (pbw) | — | 5 |
| Poly(ethylene-butylene) (pbw) | — | 5 |
| Shrinkage (%) | 0.095 | −0.016 |
| Orange Peel | 45 | 26 to 35 |
| Waviness | 1670 | 135 to 330 |

EXAMPLES 38–55

Eighteen samples were prepared varying in the type and amount of crosslinker, the type and amount of polymeric additive, the type and amount of initiator, and the molding temperature.

The base resin for all examples was a methacrylate-capped poly(2,6-dimethyl-1,4-phenylene ether) having an intrinsic viscosity of 0.12 dL/g. It was used in the form of a 50 weight percent solution in styrene. The initiator t-butyl peroxy-2-ethylhexanoate was obtained as LUPEROX® 26 from Atofina Chemicals. The initiator t-butyl perbenzoate was obtained as LUPEROX® P from Atofina Chemicals. The crosslinker was either trimethylolpropane triacrylate (TMPTA) or trimethylolpropane trimethacrylate (TMPTMA).

Five different polymeric additives were employed. A dihydroxy-terminated poly (ethylene-butylene) having a weight average molecular weight of 1,700 AMU was obtained as KRATON® L2203 from Kraton Polymers. A monohydroxy-terminated poly (ethylene-butylene) having a weight average molecular weight of 4,200 AMU was obtained as KRATON® L1203 from Kraton Polymers. A polybutadiene having a number average molecular weight of 5,000 AMU and 10–20% vinyl content was obtained as Lithene N4-5000 from Revertex Chemicals Limited, Hartlepool, UK. An ethylene-propylene-dicyclopentadiene terpolymer having an ethylene:propylene weight ratio of 48/52, 9.5 weight percent diene, a viscosity average molecular weight of 7,000 AMU, and a weight average molecular weight of 40,000 AMU was obtained as TRILENE® 65 from Uniroyal Chemical. An ethylene-propylene-ethylidene norbornene terpolymer having an ethylene:propylene weight ratio of 45/55, 9.5% diene by weight, a viscosity average molecular weight of 7,500 AMU and a weight average molecular weight of 40,000 AMU was obtained as TRILENE® 67 from Uniroyal Chemical.

All amounts in Table 6 below are grams per 3 kilogram batch. All samples contained 25 weight percent resin, 54 weight percent calcium carbonate, 20 weight percent glass fibers (OCF 163D-17C from Owens Corning), and 1 weight percent zinc stearate. The following are the same for all samples: initiator amount=15 g; zinc strearate amount=30 g; calcium carbonate amount=1620 g; molding time=2 minutes; molding pressure=1,200 psi.

The results, presented in Table 6, show reduced orange peel and waviness for the samples containing polymeric additives versus samples without them (see Comparative Examples 4 and 5, above).

Initiators and polymeric additives are described above, except for RICON® 134, which is a polybutadiene having a number average molecular weight of 8,000 AMU and 28% vinyl content, obtained from Sartomer.

All formulations were prepared on a 1.5 kilogram scale, consisting of 25 weight percent resin, 54 weight percent calcium carbonate, 20 weight percent glass fibers, and a 1 weight percent zinc stearate. Component amounts in Table 7 are in grams per 1.5 kilogram batch. The follow are constants in these samples: initiator amount=7.5 g, zinc stearate amount=15 g; calcium carbonate amount=810 g; glass fiber amount=300 g; molding time=2 minutes; molding pressure= 1,200 psi.

The results, presented in Table 7, show that the carboxy-terminated butadiene was effective at improving surface

TABLE 6

|  | Ex.38 | Ex.39 | Ex.40 | Ex.41 | Ex.42 | Ex.43 | Ex.44 |
|---|---|---|---|---|---|---|---|
| Resin Amt (pbw) | 625 | 618 | 612 | 625 | 618 | 612 | 625 |
| Crosslinker type | TMPTA | TMPTA | TMPTA | TMPTA | TMPTA | TMPTA | TMPTA |
| Crosslinker Amt (pbw) | 110 | 109 | 108 | 110 | 109 | 108 | 110 |
| Additive Type | KRATON ® L2203 | KRATON ® L2203 | KRATON ® L2203 | KRATON ® L2203 | KRATON ® L2203 | KRATON ® L2203 | KRATON ® L1230 |
| Additive Amt (pbw) | 15 | 23 | 30 | 15 | 23 | 30 | 15 |
| Initiator Type | LUPEROX ® 26 | LUPEROX ® 26 | LUPEROX ® 26 | LUPEROX ® P | LUPEROX ® P | LUPEROX ® P | LUPEROX ® 26 |
| Molding Temp (° C.) | 120 | 120 | 120 | 150 | 150 | 150 | 120 |
| Orange Peel | 24.2 | 24.0 | 31.9 | 28.4 | 31.8 | 34.4 | 33.9 |
| Waviness | 776 | 978 | 1168 | 1431 | 685 | 1092 | 1075 |

|  | Ex.45 | Ex.46 | Ex.47 | Ex.48 | Ex.49 | Ex.50 | Ex.51 |
|---|---|---|---|---|---|---|---|
| Resin Amt (pbw) | 618 | 612 | 625 | 618 | 612 | 574 | 574 |
| Crosslinker type | TMPTA | TMPTA | TMPTA | TMPTA | TMPTA | TMPTA | TMPTA |
| Crosslinker Amt (pbw) | 109 | 108 | 110 | 109 | 108 | 101 | 101 |
| Additive Type | KRATON ® L1230 | KRATON ® L1230 | KRATON ® L1230 | KRATON ® L1230 | KRATON ® L1230 | Lithene N4-5000 | TRILENE ® 65 |
| Additive Amt (pbw) | 23 | 30 | 15 | 23 | 30 | 75 | 75 |
| Initiator Type | LUPEROX ® 26 | LUPEROX ® 26 | LUPEROX ® P | LUPEROX ® P | LUPEROX ® P | LUPEROX ® P | LUPEROX ® P |
| Molding Temp (° C.) | 120 | 120 | 150 | 150 | 150 | 150 | 150 |
| Orange Peel | 29.6 | 28.0 | 37.5 | 35.5 | 34.4 | 25.0 | 27.3 |
| Waviness | 1194 | 904 | 1519 | 1590 | 1457 | 569 | 600 |

|  | Ex.52 | Ex.53 | Ex.54 | Ex.55 |
|---|---|---|---|---|
| Resin Amt (pbw) | 574 | 576 | 540 | 612 |
| Crosslinker type | TMPTA | TMPTMA | TMPTMA | TMPTMA |
| Crosslinker Amt (pbw) | 101 | 144 | 180 | 108 |
| Additive Type | TRILENE ® 67 | KRATON ® L1203 | KRATON ® L1203 | KRATON ® L1203 |
| Additive Amt (pbw) | 75 | 30 | 30 | 30 |
| Initiator Type | LUPEROX ® P | LUPEROX ® P | LUPEROX ® P | LUPEROX ® P |
| Molding Temp (° C.) | 150 | 150 | 150 | 150 |
| Orange Peel | 24.3 | 26.5 | 28.3 | 31.3 |
| Waviness | 1000 | 884 | 902 | 1044 |

EXAMPLES 56–64

Comparative Example 6

Ten samples were prepared varying in the type and amount of crosslinker, the type and amount of polymeric additive, the type and amount of initiator, and the molding temperature. The base resin for all samples was a methacrylate-capped poly (2,6-dimethyl-1,4-phenylene ether) having an intrinsic viscosity of 0.12 dL/g, which was used as a 50 weight percent solution in styrene.

quality when molded at lower temp (120° C. vs. 150° C.)—the improvement is significant relative to a control (C. Ex. 6). The CTB appeared to be more highly phase separated at the lower temp enabling low profile additive morphology and performance. Both polybutadiene (RICON® 134) and PEB (KRATON® L1203) by themselves offered improvements relative to control (C. Ex. 6), but there was a synergistic improvement over either alone when these two were combined.

TABLE 7

|  | Ex.56 | Ex.57 | C. Ex.6 | Ex.58 | Ex.59 |
|---|---|---|---|---|---|
| Resin Amt (pbw) | 287 | 287 | 300 | 285 | 270 |
| Crosslinker Type | TMPTA | TMPTA | TMPTMA | TMPTMA | TMPTMA |
| Crosslinker Amt (pbw) | 51 | 51 | 75 | 71 | 68 |
| Additive I Type | CTB HYCAR® X162 | CTB HYCAR® X162 | — | RICON® 134 | RICON® 134 |
| Additive I Amt (pbw) | 38 | 38 | — | 19 | 38 |
| Additive II Type | — | — | — | — | — |
| Additive II Amt (pbw) | 0 | 0 | 0 | 0 | 0 |
| Initiator Type | LUPEROX® 26 | LUPEROX® P | LUPEROX® P | LUPEROX® P | LUPEROX® P |
| Molding Temp ° C. | 120 | 150 | 150 | 150 | 150 |
| Shrinkage | 0.13 | 0.13 | 0.24 | 0.23 | 0.17 |
| Orange Peel | 30 | 57 | 45 | 47 | 40 |
| Waviness | 505 | 1710 | 1670 | 1805 | 1300 |

|  | Ex.60 | Ex.61 | Ex.62 | Ex.63 | Ex.64 |
|---|---|---|---|---|---|
| Resin Amt (pbw) | 293 | 285 | 285 | 270 | 287 |
| Crosslinker Type | TMPTMA | TMPTMA | TMPTMA | TMPTMA | TMPTMA |
| Crosslinker Amt (pbw) | 73 | 71 | 71 | 68 | 51 |
| Additive I Type | KRATON® 1203 | KRATON® 1203 | KRATON® 1203 | KRATON® 1203 | KRATON® 1203 |
| Additive I Amt (pbw) | 9 | 19 | 9 | 19 | 19 |
| Additive II Type | — | — | RICON® 134 | RICON® 134 | RICON® 134 |
| Additive II Amt (pbw) | 0 | 0 | 9 | 19 | 19 |
| Initiator Type | LUPEROX® P | LUPEROX® P | LUPEROX® P | LUPEROX® P | LUPEROX® P |
| Molding Temp ° C. | 150 | 150 | 150 | 150 | 150 |
| Shrinkage | 0.17 | 0.14 | 0.17 | 0.13 | 0.10 |
| Orange Peel | 40 | 40 | 43 | 32 | 33 |
| Waviness | 1520 | 910 | 1440 | 760 | 440 |

EXAMPLES 65–72

Comparative Example 7

These experiments show that the polymeric additives are also effective for reducing the painting defect known as "paint popping". Four compositions were prepared varying in base resin intrinsic viscosity, polymeric additive type, and polymeric additive amount. The base resins were a methacrylate-capped poly(2,6-dimethyl-1,4-phenylene ether) resins having an intrinsic viscosities of 0.12, and an acrylate-capped poly(2,6-dimethyl-1,4-phenylene ether) resins having an intrinsic viscosities of 0.30 dL/g. The polymeric additives were a carboxy-terminated polybutadiene ("CTB") obtained as HYCAR® 2000X162 CTB from Noveon Solutions, and a 32 weight percent solution of polystyrene ("PS") in styrene obtained as N715 from AOC Resins. All formulations consisted of 25 weight percent resin, 54 weight percent calcium carbonate, 20 weight percent glass fibers, and 1 weight percent zinc stearate. Initiator was added at 2 parts per 100 parts by weight of the base resin. t-Butyl perbenzoate, obtained as LUPEROX® P from Atofina Chemicals, was used for 150° C. cures. t-Butyl peroxy-2-ethylhexanoate, obtained as LUPEROX® 26 from Atofina Chemicals, was used for 120° C. cures. The formulated resins contained 15 weight percent of the crosslinker trimethylolpropane trimethacrylate. Component amounts are given in Table 8.

The two polymeric additives were separately blended with base resin, initiator, and crosslinker. To these mixtures, the calcium carbonate and glass were added along with the mold release agent. The resultant composite resins were divided into appropriate weight charges and each were compression molded into a 12×12 inch plaque at conditions of temperature and pressure known to result in complete cure of the thermoset. A total of three plaques were prepared for each composition. As a further control measure, the entire process was repeated on a second day, generating a second "replicate" set of three plaques for each composition.

Each of the molded plaques was subjected to an aggressive edge sanding protocol to produce rounded edges. Using an orbital sander, each edge was then sanded, using a circular motion, to obtain a rounded profile. Typically between 5 and 10 sanding passes at various angles were required to obtain a uniform rounded edge. After sanding, all samples were sent to an automotive painting company to be primed and painted under conditions identical to those experienced by automotive parts made from commercial thermoset composites. The priming/painting protocol followed the standard adopted by a consortium of automotive companies and their thermoset part suppliers (molding and priming companies.) All plaques were then returned for measurement of edge pop defects.

The plaques were clamped to a computer-controlled scanning sled that permitted the precise linear positioning of the plaque under a video camera. The scanning sled was programmed to travel 2 inches, pause for 2.5 seconds, and proceed to the next 2-inch segment of the plaque. The sled was programmed to perform this scan sequence 6 times in order to cover the entire 12-inch length of the plaque sides. The procedure was repeated 4 times in order to analyze all edges of the plaque.

Proper illumination orientation was critical in order to achieve sufficient contrast of the edge pops. A dual chromed gooseneck fiber optic light source was used to provide an angled source of light approximately 30° below the top of the plaque. Each gooseneck light source was positioned on either side of the plaque in order to minimize shadows and to illuminate edge pops on either side of the curved edge of the plaque side being analyzed.

The magnification was optimized in order to resolve the smallest typical observable edge pop (approximately 6 mils), permit a manageable number of areas for analysis from each side (6), and retain good contrast between the edge pops and the smooth painted surface. The scanning sled was positioned on a macro-stand that had a video camera with a 50 mm macro lens attached. The video camera was interfaced to a PC-based image analysis system.

The image analysis system was coordinated with the computer-controlled scanning sled such that the image analyzer would automatically digitize the image and store it to the hard drive and repeat this process 6 times in order to store 6 images from each side of a plaque. A separate routine was written which first enhanced the contrast in the image of the edge and transformed the gray level image into a binary image by selecting the characteristic gray level range of the edge pops. Once the binary image was created, the image analysis program determined the edge pop defect size for every defect detected. A Microsoft EXCEL® macro was written to determine the average edge pop defect diameter, maximum diameter, and number density for each plaque edge.

Continuous data on the individual plaque edges (four twelve-inch edges per plaque) of each separate formulation were generated for the following measurements: paint pop number per area (counts per square centimeter of sanded edge), average paint pop diameter (millimeters), and maximum paint pop diameter (millimeters). The normality of the distributions of the paint pop number data allowed calculation of a pooled average for each formulation and its replicate. For each measurement type, the average and standard deviations are therefore based on 24 measurements, corresponding to 2 batches times 3 plaques/batch times 4 edges/plaque. For example, for a given formulation, Maximum Pop Diameter and its standard deviation are obtained by measuring the maximum pop diameter for each of the 24 total edges for that formulation, then calculating an average and standard deviation based on the population of 24 maximum pop diameters. Table 8 lists the statistics of the individual formulations. These experiments demonstrate that the polymeric additives can reduce edge popping defects.

alized poly(arylene ether) was provided as a 35 weight percent solution in styrene of a methacrylate-capped poly (2,6-dimethyl-1,4-phenylene ether) having an intrinsic viscosity of 0.12 dL/g. A poly(vinyl laurate) having a number average molecular weight of 110,000 AMU was obtained from Scientific Polymer Products. Shrinkage was measured as described in Examples 1–7. Compositions and shrinkage values are provided in Table 9. Note that the ratios of resin to calcium carbonate and (resin+calcium carbonate) to glass fiber are the same for both samples. The results show that addition of the poly(vinyl ester) reduced the shrinkage of the composition.

TABLE 9

|  | C. Ex. 8 | Ex. 73 |
|---|---|---|
| COMPOSITION |  |  |
| PPO-MAA/styrene solution (pbw) | 85 | 85 |
| Trimethylolpropane trimethacrylate (pbw) | 20 | 20 |
| Poly(vinyl laurate) (pbw) | 0 | 20 |
| Zinc Stearate (pbw) | 3 | 3 |
| t-Butylperoxybenzoate (pbw) | 2 | 2 |
| Calcium carbonate (pbw) | 220 | 240 |
| Glass fiber (pbw) | 83 | 85 |
| PROPERTIES |  |  |
| Shrinkage (%) | 0.18 | 0.011 |

EXAMPLES 74 to 79

Six compositions varying in poly(vinyl ester) type were prepared. Each sample contained 80 parts by weight of at 35% solution in styrene of methacrylate-capped poly(2,6-dimethyl-1,4-phenylene ether) having an intrinsic viscosity of 0.12 dL/g, 20 parts by weight of trimethylolpropane trimethacrylate, 10 parts by weight of the poly (vinyl alkanoate), and 2 parts by weight of t-butylperoxybenzoate initiator. The poly (vinyl esters)s were poly(vinyl propionate), poly(vinyl pivalate), poly(vinyl nonanate), poly (vinyl butyrate), poly(vinyl neodecanoate), and poly(vinyl neononanate). The blends were prepared by mixing the capped-PPE, the poly(vinyl ester), and the trimethylolpropane trimethacrylate at about 50–80° C. The resulting solu-

TABLE 8

|  | C. Ex. 7 | Ex. 65 | Ex. 66 | Ex. 67 |
|---|---|---|---|---|
| Base Resin Capping Group | methacrylate | methacrylate | methacrylate | acrylate |
| Base Resin Intrinsic Viscosity (dL/g) | 0.12 | 0.12 | 0.12 | 0.30 |
| Base Resin Amount (pbw) | 626.6 | 576.5 | 501.4 | 501.4 |
| Crosslinker amount (pbw) | 113.3 | 104.2 | 90.61 | 90.61 |
| Polymeric Additive Type | (none) | CTB | PS | PS |
| Polymeric Additive Amount (pbw) | 0 | 60.38 | 150.9 | 150.9 |
| Initiator Type | LUPEROX ® P | LUPEROX ® 26 | LUPEROX ® P | LUPEROX ® P |
| Initiator Amount (pbw) | 15.1 | 13.89 | 12.08 | 12.08 |
| Zinc Stearate Amount (pbw) | 29.89 | 29.89 | 29.89 | 29.89 |
| Calcium Carbonate Amount (pbw) | 1630.1 | 1630.1 | 1630.1 | 1630.1 |
| Glass Fiber Amount (pbw) | 603.75 | 603.75 | 603.75 | 603.75 |
| Average Pop Number (counts/cm$^2$) | 3.16 | 1.74 | 1.53 | 1.41 |
| standard deviation (counts/cm$^2$) | 1.65 | 0.98 | 0.84 | 0.70 |
| Average Pop Diameter (mm) | 0.48 | 0.36 | 0.47 | 0.35 |
| standard deviation (mm) | 0.09 | 0.05 | 0.12 | 0.00 |
| Maximum Pop Diameter (mm) | 1.33 | 0.72 | 1.05 | 0.68 |
| standard deviation (mm) | 0.50 | 0.19 | 0.40 | 0.20 |

EXAMPLE 73
Comparative Example 8

Two compositions were prepared to illustrate the effect of a poly(vinyl ester) compound on shrinkage. The functiontions were cooled to about 40–60° C. before addition of the initiator. The compositions were cured at 150° C. All blends showed phase separation as indicated by the opaque white appearance of the cured discs. This opaque appearance indicates phase separation, which is an important indication of cavitation in the cured specimens. Poly(vinyl propionate) and poly(vinyl pivalate) produced the highest level of whitening.

EXAMPLES 80 to 82

Comparative Example 9

Four compositions were prepared to illustrate the effect of polysiloxane compounds on shrinkage. The functionalized poly(arylene ether) was provided as a 35 weight percent solution in styrene of a methacrylate-capped poly(2,6-dimethyl-1,4-phenylene ether) having an intrinsic viscosity of 0.12 dL/g. A vinyl-terminated polydimethylsiloxane (i.e., a polydimethylsiloxane have a vinyl group on each end) was obtained from Aldrich Chemical Company. A polydimethylsiloxane-co-methyl-3-hydroxypropylsiloxane-graft-poly(ethylene-propylene) glycol was obtained from Aldrich Chemical Company. A hydroxy-terminated polydimethylsiloxane was obtained from Aldrich Chemical Company. Shrinkage was measured as described in Examples 1–7. Compositions and shrinkage values are provided in Table 10. The results show that addition of the vinyl-terminated and dihydroxy-terminated polydimethylsiloxanes reduced the shrinkage of the composition.

TABLE 10

|  | C. Ex. 9 | Ex. 80 | Ex. 81 | Ex. 82 |
|---|---|---|---|---|
| COMPOSITION |  |  |  |  |
| PPO-MAA/styrene solution (pbw) | 85 | 85 | 85 | 85 |
| Trimethylolpropane trimethacrylate (pbw) | 20 | 20 | 20 | 20 |
| Vinyl-terminated polydimethyl-siloxane (pbw) | 0 | 10 | 0 | 0 |
| Polydimethylsiloxane-co-methyl-3-hydroxypropylsiloxane-graft-poly(ethylene-propylene) glycol (pbw) | 0 | 0 | 10 | 0 |
| Hydroxy-terminated polydimethyl-siloxane (pbw) | 0 | 0 | 0 | 10 |
| Zinc Stearate (pbw) | 3 | 3 | 3 | 3 |
| t-Butylperoxybenzoate (pbw) | 2 | 2 | 2 | 2 |
| Calcium carbonate (pbw) | 220 | 240 | 240 | 240 |
| Glass fibers (pbw) | 83 | 85 | 88 | 88 |
| PROPERTIES |  |  |  |  |
| Shrinkage (%) | 0.18 | 0.052 | 0.21 | 0.072 |

EXAMPLES 83 to 92

Comparative Examples 10–12

Thirteen compositions were prepared varying in amounts of three polymeric additives, and amounts of magnesium oxide, titanium dioxide, and calcium carbonate. Components are as described above, except for a maleic anhydride-functionalized polybutadiene having a number average molecular weight of 5,300 AMU and 18–33% 1,2-vinyl content, obtained as RICON® 131MA5 from Sartomer; a calcium carbonate having a particle size of 6 micrometers, obtained as CamelFil 6μ; and chopped one inch glass roving, obtained as PPG 5530 from PPG.

Batches of filled resin, 18 kg in size, were compounded using a Cowles blade mixer in five-gallon pails by first heating the base PPO in styrene resin and crosslinker to 35° C. Calcium carbonate, preheated in a cement mixer with a kerosene forced-air heater to between 55° C. and 65° C., was then combined with titanium oxide and zinc stearate and added to form a paste. Polymeric additives were incorporated next, and then, immediately before coating, the magnesium oxide and initiator were added.

Sheet molding compound (SMC) was produced from the compositions using a 60 cm wide line. The line included various elements to add heat to the process. The aluminum plates beneath both doctor boxes were heated with circulating water to bring the surface temperatures of the first and second boxes to 35° C. and 45° C., respectively. Hot water at 90° C. was circulated through the compaction rollers, and the entire compaction area was enclosed and maintained at 40° C. with the aid of a warm air convection heater. The doctor blades on both resin boxes were set with a 0.098 inch gap. Pressure on the compactor roles was set at 10 psi at the entrance, 20 psi for rolls 2 through 8, and at 40 psi on the exit roller.

Sheet molding compounds were compression molded using a Class-A mold manufactured by ToolPlas of Windsor, Ontario, Canada. Stacks of four 15 centimeter SMC squares weighing 650 g each were formed into 3 mm thick by 30 cm square plaques by compression molding at 150° C. and 1200 psi for 2 minutes. Thus, the typical charge coverage on the molding area was 25%, but in limited studies complete coverage was explored.

For shrinkage measurements, each molded plaque was clamped flat into a specially made jig and the deviation from a calibrated part width was measured at two points on orthogonal sides. Each plaque was rotated 90 degrees and remeasured to minimize part orientation effects. Shrinkage was calculated relative to the zero calibrations established by the manufacturer of the device. Three plaques were tested for each formulation and the average and standard deviation for each composition are provided in Table 11. At least a four-fold reduction in shrinkage was obtained when the polymeric additive combination of a poly(ethylene-butene) and a polybutadiene was employed (Exs. 83–92 vs. C. Exs. 10–12).

Waviness and orange peel were measured as described above, using surfaces painted gloss black. Examples 83–92 comprising polymeric additives exhibited substantially lower waviness and orange peel values than Comparative Examples 10–12 lacking polymeric additives.

TABLE 11

|  | C. Ex.10 | C. Ex.11 | C. Ex.12 | Ex.83 | Ex.84 | Ex.85 |
|---|---|---|---|---|---|---|
| COMPOSITION |  |  |  |  |  |  |
| 50% PPO-MAA/styrene solution (pbw) | 80.0 | 80.0 | 80.0 | 72.0 | 72.0 | 72.0 |
| Trimethylolpropane trimethacrylate (pbw) | 20.0 | 20.0 | 20.0 | 18.0 | 18.0 | 18.0 |
| KRATON L1203 (pbw) | 0 | 0 | 0 | 5 | 5 | 5 |
| RICON 134 (pbw) | 0 | 0 | 5 | 5 | 5 | 5 |

TABLE 11-continued

|  | | | | | | |
|---|---|---|---|---|---|---|
| RICON 131MA (pbw) | 0 | 0 | 0 | 0 | 0 | 0 |
| t-Butylperoxybenzoate (pbw) | 2 | 2 | 2 | 2 | 2 | 2 |
| Zinc Stearate (pbw) | 3 | 3 | 3 | 3 | 3 | 3 |
| Magnesium Oxide (pbw) | 0.3 | 0.3 | 0.3 | 0.3 | 0.3 | 0.3 |
| Titanium Dioxide (pbw) | 0 | 15 | 15 | 0 | 15.0 | 15.0 |
| Calcium Carbonate (pbw) | 200 | 185 | 185 | 200 | 185 | 185 |
| Glass Fibers (pbw) | 111 | 111 | 111 | 111 | 111 | 111 |
| PROPERTIES | | | | | | |
| Shrinkage, avg. (%) | 0.148 | 0.178 | 0.160 | 0.020 | 0.035 | 0.020 |
| Shrinkage, stddev. (%) | 0.012 | 0.026 | 0.014 | 0.011 | 0.017 | 0.008 |
| Orange Peel, avg. | 49.8 | 50.8 | 42.5 | 26.5 | 29.0 | 26.5 |
| Orange Peel, stddev. | 5.4 | 2.7 | 4.8 | 4.4 | 1.3 | 3.1 |
| Waviness, avg. | 1590.0 | 1513.3 | 1613.3 | 981.7 | 868.3 | 1013.8 |
| Waviness, stddev. | 253.1 | 325.3 | 247.6 | 408.8 | 180.0 | 322.1 |

|  | Ex. 86 | Ex. 87 | Ex. 88 | Ex. 89 | Ex. 90 | Ex. 91 | Ex. 92 |
|---|---|---|---|---|---|---|---|
| COMPOSITION | | | | | | | |
| PPO-MAA/styrene solution (pbw) | 72.0 | 72.0 | 72.0 | 68.0 | 68.0 | 68.0 | 68.0 |
| Trimethylolpropane trimethacrylate (pbw) | 18.0 | 18.0 | 18.0 | 17.0 | 17.0 | 17.0 | 17.0 |
| KRATON L1203(pbw) | 5 | 5 | 5 | 5 | 5 | 5 | 5 |
| RICON 134(pbw) | 5 | 5 | 5 | 5 | 5 | 5 | 5 |
| RICON 131MA(pbw) | 0 | 0 | 0 | 5 | 5 | 5 | 5 |
| t-Butylperoxybenzoate (pbw) | 2 | 2 | 2 | 2 | 2 | 2 | 2 |
| Zinc Stearate (pbw) | 3 | 3 | 3 | 3 | 3 | 3 | 3 |
| Magnesium Oxide (pbw) | 0.3 | 0.3 | 0.3 | 0.3 | 0.3 | 0.3 | 1.0 |
| Titanium Dioxide (pbw) | 15.0 | 15.0 | 15.0 | 0 | 15.0 | 15.0 | 15.0 |
| Calcium Carbonate (pbw) | 185 | 185 | 185 | 200 | 185 | 185 | 185 |
| Glass Fibers (pbw) | 111 | 111 | 111 | 111 | 111 | 111 | 111 |
| PROPERTIES | | | | | | | |
| Shrinkage, avg. (%) | 0.016 | 0.014 | 0.019 | 0.006 | 0.011 | −0.010 | 0.034 |
| Shrinkage, stddev. (%) | 0.014 | 0.031 | 0.014 | 0.015 | 0.011 | 0.012 | 0.014 |
| Orange Peel, avg. | 25.7 | — | 28.0 | 20.8 | 20.3 | 15.0 | — |
| Orange Peel, stddev. | 3.4 | — | 4.1 | 1.2 | 3.9 | 1.4 | — |
| Waviness, avg. | 1208.5 | — | 680.0 | 591.7 | 705.0 | 370.0 | — |
| Waviness, stddev. | 417.8 | — | 211.8 | 63.9 | 175.0 | 205.1 | — |

The results of the above experiments show that the compositions comprising the polymeric additives exhibit reduced shrinkage and improved surface smoothness relative to compositions without the polymeric additives.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

All cited patents, patent applications, and other references are incorporated herein by reference in their entirety.

What is claimed is:

1. A curable composition, comprising:
   a functionalized poly(arylene ether);
   an alkenyl aromatic monomer;
   an acryloyl monomer; and
   a polymeric additive having a glass transition temperature less than or equal to 100° C. and a Young's modulus less than or equal to 1000 megapascals at 25° C.;
   wherein the polymeric additive is soluble in the combined functionalized poly(arylene ether), alkenyl aromatic monomer, and acryloyl monomer at a temperature less than or equal to 50° C.

2. A curable composition, comprising:
   a functionalized poly(arylene ether);
   an alkenyl aromatic monomer;
   an acryloyl monomer; and
   a polymeric additive having a glass transition temperature less than or equal to 100° C. and a Young's modulus less than or equal to 1000 megapascals at 25° C.;
   wherein the polymeric additive is soluble in the combined functionalized poly(arylene ether), alkenyl aromatic monomer, and acryloyl monomer at a temperature less than or equal to 30° C.

3. A curable composition, comprising:
   a functionalized poly(arylene ether);
   an alkenyl aromatic monomer;
   an acryloyl monomer; and
   a polymeric additive having a glass transition temperature less than or equal to 25° C. and a Young's modulus less than or equal to 1000 megapascals at 25° C.;
   wherein the polymeric additive is soluble in the combined functionalized poly(arylene ether), alkenyl aromatic monomer, and acryloyl monomer at a temperature less than or equal to 50° C.

4. A curable composition, comprising:
   a functionalized poly(arylene ether);
   an alkenyl aromatic monomer;
   an acryloyl monomer; and
   a polymeric additive having a glass transition temperature less than or equal to 100° C. and a Young's modulus less than or equal to 100 megapascals at 25° C.;

wherein the polymeric additive is soluble in the combined functionalized poly(arylene ether), alkenyl aromatic monomer, and acryloyl monomer at a temperature less than or equal to 50° C.

5. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.:

wherein the polymeric additive is soluble in the combined functionalized poly(arylene ether), alkenyl aromatic monomer, and acryloyl monomer at a temperature less than or equal to 50° C.; and wherein the polymeric additive is selected from the group consisting of poly(alkenyl hydrocarbon)s, poly(alkyl (meth)acrylate)s, poly(vinyl ester)s, polysiloxanes, and combinations comprising at least one of the foregoing polymeric additives.

6. The curable composition of claim 1, wherein the polymeric additive comprises a poly(alkenyl hydrocarbon).

7. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkenyl hydrocarbon) comprises at least about 80 weight percent of repeating structural units having the formula

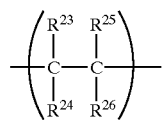

wherein $R^{23}$–$R^{26}$ are each independently hydrogen, $C_1$–$C_{12}$ alkyl, $C_2$–$C_{12}$ alkenyl, $C_6$–$C_{18}$ aryl, $C_7$–$C_{18}$ aralkyl, or $C_7$–$C_{18}$ alkylaryl.

8. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.; and wherein the polymeric additive comprises a poly(alkenyl hydrocarbon);

wherein the poly(alkenyl hydrocarbon) comprises at least about 80 weight percent of repeating structural units having the formula

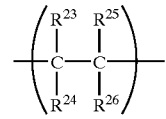

wherein $R^{23}$–$R^{26}$ are each independently hydrogen, $C_1$–$C_{12}$ alkyl, or $C_2$–$C_{12}$ alkenyl.

9. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkenyl hydrocarbon) is selected from the group consisting of polybutadiene; polyethylene; polypropylene; polybutene; poly(4-methyl-1-pentene); a block copolymer comprising a first block that is the polymerization product of styrene and/or alpha-methyl styrene and a second block that is the hydrogenated polymerization product of butadiene and/or isoprene; and combinations comprising at least one of the foregoing poly(alkenyl hydrocarbon)s.

10. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkenyl hydrocarbon) is selected from the group consisting of polyethylenes, polypropylenes, poly(4-methyl-1-pentene)s, polybutadienes, carboxy-terminated butadienes, carboxy-terminated butadiene-acrylonitrile copolymers, polyisobutenes, polyisoprenes, ethylene-propylene copolymers, ethylene-propylene-diene terpolymers, styrene-butadiene copolymers, styrene-isoprene copolymers, isobutylene-isoprene copolymers, butadiene-isoprene copolymers, and combinations comprising at least one of the foregoing poly(alkenyl hydrocarbon)s.

11. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the polymeric additive comprises a poly(alkyl (meth)acrylate).

12. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkyl(meth)acrylate) comprises at least 80 weight percent of repeating structural units having the formula

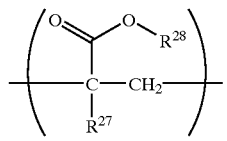

wherein each $R^{27}$ is independently hydrogen or methyl, and each $R^{28}$ is independently $C_1$–$C_{12}$ alkyl.

13. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkyl(meth)acrylate) comprises at least 80 weight percent of repeating structural units having the formula

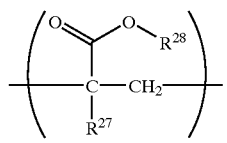

wherein each $R^{27}$ is independently hydrogen or methyl, and each $R^{28}$ is independently $C_1$–$C_{12}$ alkyl.

14. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(alkenyl hydrocarbon); and wherein the poly(alkyl(meth)acrylate) is selected from the group consisting of poly(butyl acrylate), poly(2-hexyl acrylate), and combinations comprising at least one of the foregoing poly(alkyl(meth)acrylate)s.

15. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.; and wherein the polymeric additive comprises a poly(vinyl ester).

16. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(vinyl ester); and wherein the poly(vinyl ester) comprises at least 80 weight percent of repeating structural units having the formula

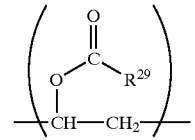

wherein each $R^{29}$ is independently $C_1$–$C_{18}$ alkyl, $C_2$–$C_{18}$ alkenyl, $C_2$–$C_{18}$ alkynyl, $C_6$–$C_{18}$ aryl, $C_7$–$C_{18}$ alkylaryl, or $C_7$–$C_{18}$ aralkyl, wherein each of the foregoing groups may, optionally, be substituted with one or more substituents including epoxy, hydroxy, amino, carboxyl, and the like.

17. A curable composition, comprising:

a functionalized poly(arylene ether);

an alkenyl aromatic monomer;

an acryloyl monomer; and a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.;

wherein the polymeric additive comprises a poly(vinyl ester); and wherein the poly(vinyl ester) comprises at least 80 weight percent of repeating structural units having the formula

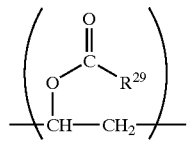

wherein each $R^{29}$ is independently $C_1$–$C_{18}$ alkyl, which may, optionally, be substituted with one or more substituents selected from epoxy, hydroxy, amino, and carboxyl.

18. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.;
wherein the polymeric additive comprises a poly(vinyl ester); and
wherein the poly(vinyl ester) comprises a poly(vinyl acetate).

19. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the polymeric additive is a copolymer comprising at least about 80 weight percent of the polymerization product of at least a first monomer type and a second monomer type, wherein the first monomer type and the second monomer type are different and independently selected from the group consisting of alkenyl hydrocarbons, alkyl(meth)acrylates, vinyl alkanoates, and nitrites.

20. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the polymeric additive is a copolymer selected from the group consisting of poly(butadiene-co-acrylonitrile), carboxy-terminated poly(butadiene-co-acrylonitrile), and combinations comprising at least one of the foregoing copolymers.

21. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the polymeric additive comprises a butadiene-acrylonitrile copolymer, a polychloroprene butadiene-styrene copolymer, or a combination thereof.

22. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the polymeric additive is a copolymer selected from the group consisting of ethylene-vinyl acetate copolymers, ethylene-ethyl acrylate copolymers, acrylonitrile-butadiene copolymers, methyl methacrylate-butadiene-styrene terpolymers, ethylacrylate-acrylonitrile copolymers, maleic anhydride-grafted polybutadienes, vinyl chloride-vinyl acetate-acrylic acid terpolymers, ethylene-vinyl acetate-acrylic acid terpolymers, and combinations comprising at least one of the foregoing copolymers.

23. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the polymeric additive comprises a polysiloxane.

24. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.;
wherein the polymeric additive comprises a polysiloxane; and wherein the polysiloxane has the formula

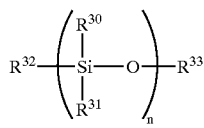

wherein $R^{30}$–$R^{33}$ are each independently hydrogen, hydroxy, $C_1$–$C_{12}$ alkyl, $C_1$–$C_{12}$ alkoxy, $C_2$–$C_{12}$ alkenyl, $C_2$–$C_{12}$ alkynyl, $C_6$–$C_{18}$ aryl, $C_7$–$C_{18}$ alkylaryl, and $C_7$–$C_{18}$ aralkyl, wherein each of the foregoing groups may, optionally, be substituted with one or more substituents selected from the group consisting of epoxy, hydroxy, cyano, amido, amino, and carboxyl; and n is about 3 to about 10,000.

25. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.;
wherein the polymeric additive comprises a polysiloxane;
wherein the polysiloxane has the formula

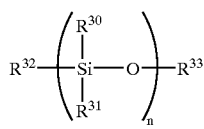

wherein $R^{30}$–$R^{33}$ are each independently $C_1$–$C_{12}$ alkyl or $C_2$–$C_{12}$ alkenyl, wherein each of the foregoing groups may, optionally, be substituted with one or more substituents selected from the group consisting of epoxy, hydroxy, cyano, amido, amino, and carboxyl; and n is about 3 to about 10,000.

26. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.;
wherein the polymeric additive comprises a polysiloxane; and
wherein the polysiloxane is selected from the group consisting of methyl silicones with phenyl and vinyl groups, and combinations comprising at least one of the foregoing polysiloxanes.

27. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;

wherein the polymeric additive is soluble in the combined functionalized poly(arylene ether), alkenyl aromatic monomer, and acryloyl monomer at a temperature less than or equal to 50° C.; and
comprising about 0.1 to about 30 parts by weight of the polymeric additive, based on 100 parts by weight total of the functionalized poly(arylene ether), the alkenyl aromatic monomer, the acryloyl monomer, and the polymeric additive.

28. The composition of claim 1, wherein the functionalized poly(arylene ether) is a capped poly(arylene ether) having the structure

wherein Q is the residuum of a monohydric, dihydric, or polyhydric phenol; y is 1 to 100; J comprises repeating structural units having the formula

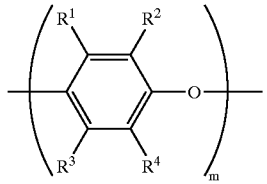

wherein $R^1$–$R^4$ are each independently selected from the group consisting of hydrogen, halogen, primary or secondary $C_1$–$C_{12}$ alkyl, $C_2$–$C_{12}$ alkenyl, $C_2$–$C_{12}$ alkynyl, $C_1$–$C_{12}$ aminoalkyl, $C_1$–$C_{12}$ hydroxyalkyl, phenyl, $C_1$–$C_{12}$ haloalkyl, $C_1$–$C_{12}$ hydrocarbonoxy, and $C_2$–$C_{12}$ halohydrocarbonoxy wherein at least two carbon atoms separate the halogen and oxygen atoms; m is 1 to about 200; and K is a capping group selected from the group consisting of

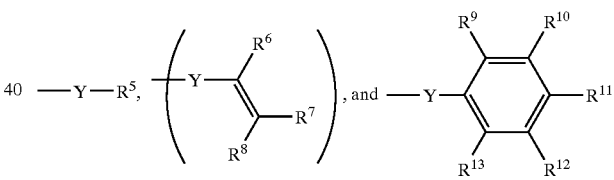

wherein $R^5$ is $C_1$–$C_{12}$ alkyl; $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate; $R^9$–$R^{13}$ are each independently selected from the group consisting of hydrogen, halogen, $C_1$–$C_{12}$ alkyl, hydroxy, and amino; and wherein Y is a divalent group selected from the group consisting of

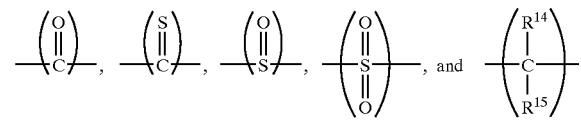

wherein $R^{14}$ and $R^{15}$ are each independently selected from the group consisting of hydrogen and $C_1$–$C_{12}$ alkyl.

29. The composition of claim 28, wherein Q is the residuum of a monohydric phenol.

30. The composition of claim 28, wherein the capped poly(arylene ether) comprises at least one capping group having the structure

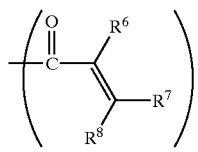

wherein $R^6$–$R^8$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate.

31. The composition of claim 1, wherein the functionalized poly(arylene ether) is a ring-functionalized poly(arylene ether) comprising repeating structural units having the formula

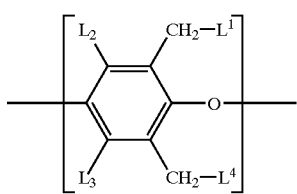

wherein each $L^1$–$L^4$ is independently hydrogen, an alkenyl group, or an alkynyl group; wherein the alkenyl group is represented by

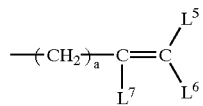

wherein $L^5$–$L^7$ are independently hydrogen or methyl, and a is an integer from 1 to 4; wherein the alkynyl group is represented by

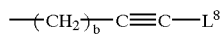

wherein $L^8$ is hydrogen, methyl, or ethyl, and b is an integer from 1 to 4; and wherein about 0.02 mole percent to about 25 mole percent of the total $L^1$–$L^4$ substituents in the ring-functionalized poly(arylene ether) are alkenyl and/or alkynyl groups.

32. The composition of claim 1, comprising about 10 to about 90 parts by weight of the functionalized poly(arylene ether) per 100 parts by weight total of the functionalized poly(arylene ether), the alkenyl aromatic monomer, the acryloyl monomer, and the polymeric additive.

33. The composition of claim 1, wherein the alkenyl aromatic monomer has the structure

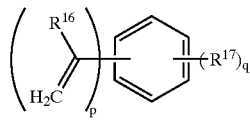

wherein each $R^{16}$ is independently selected from the group consisting of hydrogen, $C_1$–$C_{12}$ alkyl, $C_2$–$C_{12}$ alkenyl, $C_2$–$C_{12}$ alkynyl, and $C_6$–$C_{18}$ aryl; each $R^{17}$ is independently selected from the group consisting of halogen, $C_1$–$C_{12}$ alkyl, $C_1$–$C_{12}$ alkoxyl, and $C_6$–$C_{18}$ aryl; p is 1 to 4; and q is 0 to 5.

34. The composition of claim 1, wherein the alkenyl aromatic monomer comprises at least one alkenyl aromatic monomer selected from the group consisting of styrene, alpha-methylstyrene, 2-methylstyrene, 3-methylstyrene, 4-methylstyrene, 2-t-butylstyrene, 3-t-butylstyrene, 4-t-butylstyrene, 1,3-divinylbenzene, 1,4-divinylbenzene, 1,3-diisopropenylbenzene, 1,4-diisopropenylbenzene, styrenes having from 1 to 5 halogen substituents on the aromatic ring, and mixtures comprising at least one of the foregoing alkenyl aromatic monomers.

35. The composition of claim 1, comprising about 10 to about 90 parts by weight of the alkenyl aromatic monomer per 100 parts by weight total of the functionalized poly(arylene ether), the alkenyl aromatic monomer, the acryloyl monomer, and the polymeric additive.

36. The composition of claim 1, wherein the acryloyl monomer comprises at least one acryloyl moiety having the structure

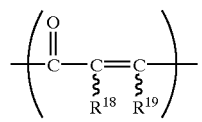

wherein $R^{18}$ and $R^{19}$ are each independently selected from the group consisting of hydrogen and $C_1$–$C_{12}$ alkyl, and wherein $R^{18}$ and $R^{19}$ may be disposed either cis or trans about the carbon-carbon double bond.

37. The composition of claim 1, wherein the acryloyl monomer comprises at least one acryloyl moiety having the structure

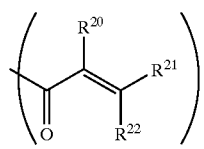

wherein $R^{20}$–$R^{22}$ are each independently selected from the group consisting of hydrogen, $C_1$–$C_{12}$ alkyl, $C_2$–$C_{12}$ alkenyl, $C_6$–$C_{18}$ aryl, $C_7$–$C_{18}$ alkyl-substituted aryl, $C_7$–$C_{18}$ aryl-substituted alkyl, $C_2$–$C_{12}$ alkoxycarbonyl, $C_7$–$C_{18}$ aryloxycarbonyl, $C_8$–$C_{18}$ alkyl-substituted aryloxycarbonyl, $C_8$–$C_{18}$ aryl-substituted alkoxycarbonyl, nitrile, formyl, carboxylate, imidate, and thiocarboxylate.

38. The composition of claim 37, wherein the acryloyl monomer comprises at least two acryloyl moieties.

39. The composition of claim 1, wherein the acryloyl monomer comprises at least one acryloyl monomer selected from the group consisting of trimethylolpropane tri(meth)acrylate, 1,6-hexanediol di(meth)acrylate, ethylene glycol di(meth)acrylate, propylene glycol di(meth)acrylate, cyclohexanedimethanol di(meth)acrylate, butanediol di(meth)acrylate, diethylene glycol di(meth)acrylate, triethylene glycol di(meth)acrylate, isobornyl(meth)acrylate, methyl(meth)acrylate, and mixtures comprising at least one of the foregoing acryloyl monomers.

40. The composition of claim 1, comprising about 1 to about 50 parts by weight of the acryloyl monomer per 100 parts by weight total of the functionalized poly(arylene ether), the alkenyl aromatic monomer, the acryloyl monomer, and the polymeric additive.

41. The composition of claim 1, further comprising a curing catalyst.

42. The composition of claim 41, wherein the curing catalyst comprises at least one curing catalyst selected from the group consisting of benzoyl peroxide, dicumyl peroxide, methyl ethyl ketone peroxide, lauryl peroxide, cyclohexanone peroxide, t-butyl hydroperoxide, t-butyl benzene hydroperoxide, t-butyl peroctoate, 2,5-dimethylhexane-2,5-dihydroperoxide, 2,5-dimethyl-2,5-di(t-butylperoxy)-hex-3-yne, di-t-butylperoxide, t-butylcumyl peroxide, alpha, alpha'-bis(t-butylperoxy-m-isopropyl)benzene, 2,5-dimethyl-2,5-di(t-butylperoxy)hexane, dicumylperoxide, di(t-butylperoxy isophthalate, t-butylperoxybenzoate, 2,2-bis(t-butylperoxy)butane, 2,2-bis(t-butylperoxy) octane, 2,5-dimethyl-2,5-di(benzoylperoxy)hexane, di(trimethylsilyl)peroxide, trimethylsilylphenyltriphenylsilyl-peroxide, 2,3-dimethyl-2, 3-diphenylbutane, 2,3-trimethylsilyloxy-2,3-diphenylbutane, and mixtures comprising at least one of the foregoing curing catalysts.

43. The composition of claim 1, further comprising a particulate filler.

44. The composition of claim 43, wherein the particulate filler is calcium carbonate.

45. The composition of claim 43, comprising about 5 to about 80 weight percent of the particulate filler, based on the total weight of the composition.

46. The composition of claim 1, further comprising a fibrous filler.

47. The composition of claim 46, wherein the fibrous filler is glass fibers.

48. The composition of claim 46, comprising about 2 to about 80 weight percent of the fibrous filler, based on the total weight of the composition.

49. The composition of claim 1, further comprising an additive selected from the group consisting of flame retardants, mold release agents and other lubricants, antioxidants, thermal stabilizers, ultraviolet stabilizers, pigments, dyes, colorants, anti-static agents, conductive agents, curing promoters, and combinations comprising at least one of the foregoing additives.

50. The composition of claim 1, wherein the composition after molding exhibits a shrinkage at least 10% less than the shrinkage exhibited by a corresponding composition without the polymeric additive.

51. The composition of claim 1, wherein the composition after molding in a Class A surface mold exhibits an orange peel value less than 40.

52. A curable composition, comprising:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly(arylene ether), alkenyl aromatic monomer, and acryloyl monomer at a temperature less than or equal to 50° C.; and
wherein the composition after molding in a Class A surface mold exhibits an orange peel value less than 300.

53. A curable composition, comprising:
about 10 to about 90 parts by weight of a functionalized poly(arylene ether);
about 10 to about 90 parts by weight of an alkenyl aromatic monomer;
about 1 to about 50 parts by weight of an acryloyl monomer; and
about 0.1 to about 30 parts by weight of a polymeric additive having a glass transition temperature less than or equal to 100° C. and a Young's modulus less than or equal to 1000 megapascals at 25° C.;
wherein the polymeric additive is soluble in the combined functionalized poly (arylene ether), alkenyl aromatic monomer, and acryloyl monomer at a temperature less than or equal to 50° C.; and
wherein all parts by weight are based on 100 parts by weight total of the functionalized poly(arylene ether), the alkenyl aromatic monomer, the acryloyl monomer, and the polymeric additive.

54. A curable composition, comprising:
about 20 to about 60 parts by weight of a methacrylate-capped poly(arylene ether);
about 20 to about 60 parts by weight of styrene;
about 5 to about 20 parts by weight of an acryloyl monomer; and
about 5 to about 20 parts by weight of a polymeric additive having a glass transition temperature less than or equal to 25° C. and a Young's modulus less than or equal to 100 megapascals at 25° C.;
wherein the polymeric additive is soluble in the combined functionalized poly (arylene ether), alkenyl aromatic monomer, and acryloyl monomer at a temperature less than or equal to 30° C.; and
wherein all parts by weight are based on 100 parts by weight total of the functionalized poly(arylene ether), the alkenyl aromatic monomer, the acryloyl monomer, and the polymeric additive.

55. A composition comprising the reaction products of:
a functionalized poly(arylene ether);
an alkenyl aromatic monomer;
an acryloyl monomer; and
a polymeric additive having a glass transition temperature less than or equal to 100° C. and a Young's modulus less than or equal to 1000 megapascals at 25° C.;
wherein the polymeric additive is soluble in the combined functionalized poly (arylene ether), alkenyl aromatic monomer, and acryloyl monomer at a temperature less than or equal to 50° C.

56. An article comprising the composition of claim 55.

57. An article comprising the composition of claim 55 and selected from the group consisting of acid bath containers, neutralization tanks, electrorefining tanks, water softener tanks, fuel tanks, filament-wound tanks, filament-wound tank linings, electrolytic cells, exhaust stacks, scrubbers, automotive exterior panels, automotive floor pans, automotive air scoops, truck bed liners, drive shafts, drive shaft couplings, tractor parts, transverse leaf springs, crankcase heaters, heat shields, railroad tank cars, hopper car covers, boat hulls, submarine hulls, boat decks, marine terminal fenders, aircraft components, propeller blades, missile components, rocket motor cases, wing sections, sucker rods, fuselage sections, wing skins, wing flairings, engine narcelles, cargo doors, aircraft stretch block and hammer forms, bridge beams, bridge deckings, stair cases, railings, walkways, pipes, ducts, fan housings, tiles, building panels, scrubbing towers, flooring, expansion joints for bridges, injectable mortars for patch and repair of cracks in structural concrete, grouting for tile, machinery rails, metal dowels, bolts, posts, electrical encapsulants, electrical panels, printed circuit boards, electrical components, wire windings, seals for electromechanical devices, battery cases, resistors, fuses, thermal cut-off devices, coatings for printed wiring boards, capacitors, transformers, electrically conductive components for antistatic applications, tennis racquets, golf club shafts, fishing rods, skis, ski poles, bicycle parts, swimming pools, swimming pool slides, hot tubs, saunas, mixers, business machine housings, trays, dishwasher parts, refrigerator parts, furniture, garage doors, gratings, protective body gear, luggage, optical waveguides, radomes, satellite dishes, signs, solar energy panels, telephone switchgear housings, transformer covers, insulation for rotating machines, commutators, core insulation, dry toner resins, bonding jigs, inspection fixtures, industrial metal forming dies, and vacuum molding tools.

58. An automotive part comprising the composition of claim 55.

* * * * *

UNITED STATES PATENT AND TRADEMARK OFFICE
CERTIFICATE OF CORRECTION

PATENT NO. : 6,878,782 B2
DATED : April 12, 2005
INVENTOR(S) : Merfeld et al.

It is certified that error appears in the above-identified patent and that said Letters Patent is hereby corrected as shown below:

Column 10,
Line 16, after "of" delete "a n" and insert therefor -- an --.

Column 38,
Line 31, after "of" delete "at" and insert therefor -- a --.

Column 46,
Line 56, delete "including epoxy, hydroxy, amino, carboxyl, and the like." and insert therefor -- selected from epoxy, hydroxy, amino and carboxyl. --.

Signed and Sealed this

Thirtieth Day of August, 2005

JON W. DUDAS
*Director of the United States Patent and Trademark Office*